US011437473B2

(12) United States Patent
Otake

(10) Patent No.: US 11,437,473 B2
(45) Date of Patent: Sep. 6, 2022

(54) NITRIDE SEMICONDUCTOR DEVICE AND METHOD OF MANUFACTURING THE SAME

(71) Applicant: ROHM Co., Ltd., Kyoto (JP)

(72) Inventor: Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 218 days.

(21) Appl. No.: 16/885,407

(22) Filed: May 28, 2020

(65) Prior Publication Data

US 2020/0381518 A1   Dec. 3, 2020

(30) Foreign Application Priority Data

May 30, 2019   (JP) .............................. JP2019-101683

(51) Int. Cl.
*H01L 29/778* (2006.01)
*H01L 29/66* (2006.01)
*H01L 29/20* (2006.01)

(52) U.S. Cl.
CPC .... *H01L 29/2003* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| 2017/0194474 A1* | 7/2017 | Shirota | H01L 29/205 |
| 2018/0097070 A1* | 4/2018 | Miura | H01L 29/94 |
| 2021/0226019 A1* | 7/2021 | Takatani | H01L 29/0696 |

FOREIGN PATENT DOCUMENTS

| JP | 2017073506 A | 4/2017 |
| JP | 2018157177 A | 10/2018 |

* cited by examiner

*Primary Examiner* — Grant S Withers
(74) *Attorney, Agent, or Firm* — Hamre, Schumann, Mueller & Larson, P.C.

(57) ABSTRACT

A nitride semiconductor device includes: a first nitride semiconductor layer constituting an electron transit layer; a second nitride semiconductor layer formed on the first nitride semiconductor layer and constituting an electron supply layer; a ridge-shaped gate portion formed on the second nitride semiconductor layer; and a source electrode and a drain electrode disposed on the second nitride semiconductor layer so as to face each other with the ridge-shaped gate portion interposed therebetween, wherein the ridge-shaped gate portion includes: a nitride semiconductor gate layer containing acceptor-type impurities and disposed on the second nitride semiconductor layer; a gate metal film disposed on the nitride semiconductor gate layer; a gate insulating film formed on the gate metal film; and a gate electrode capacitively-coupled to the gate metal film by the gate insulating film.

20 Claims, 27 Drawing Sheets

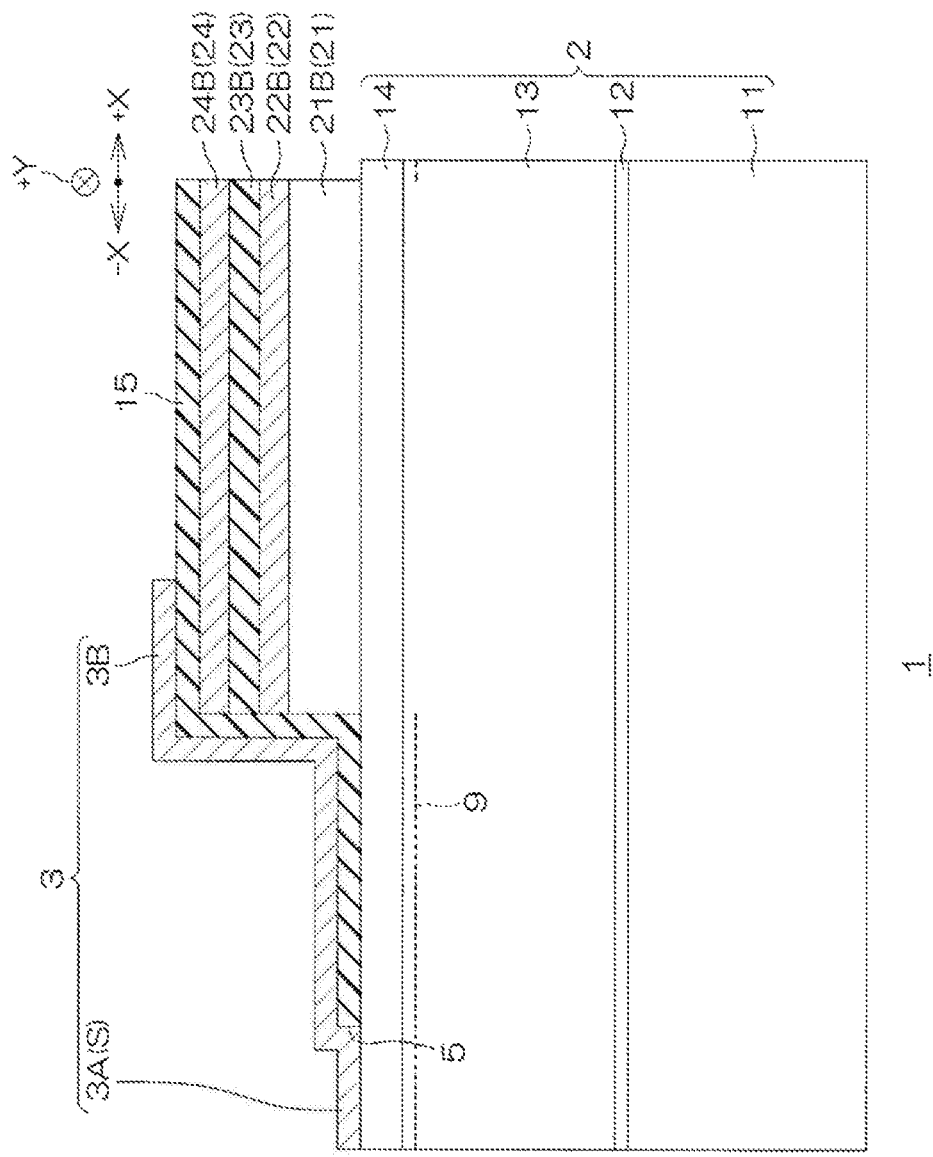

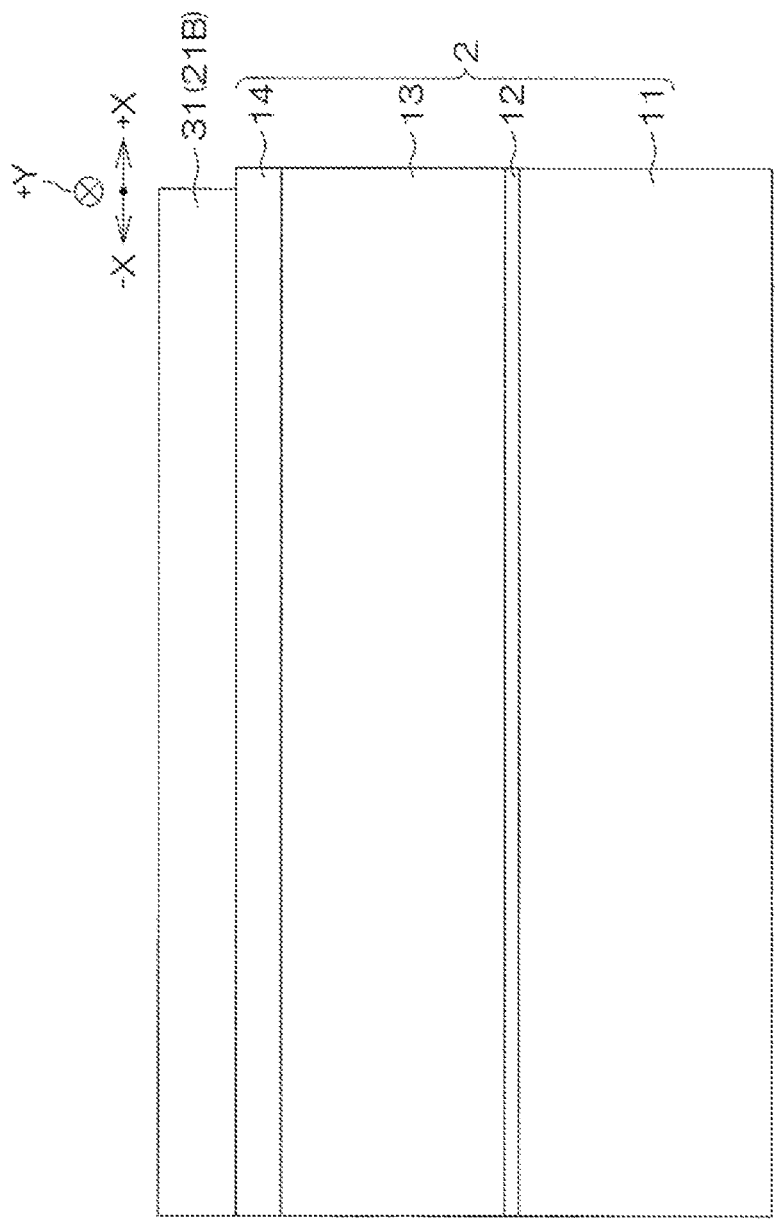

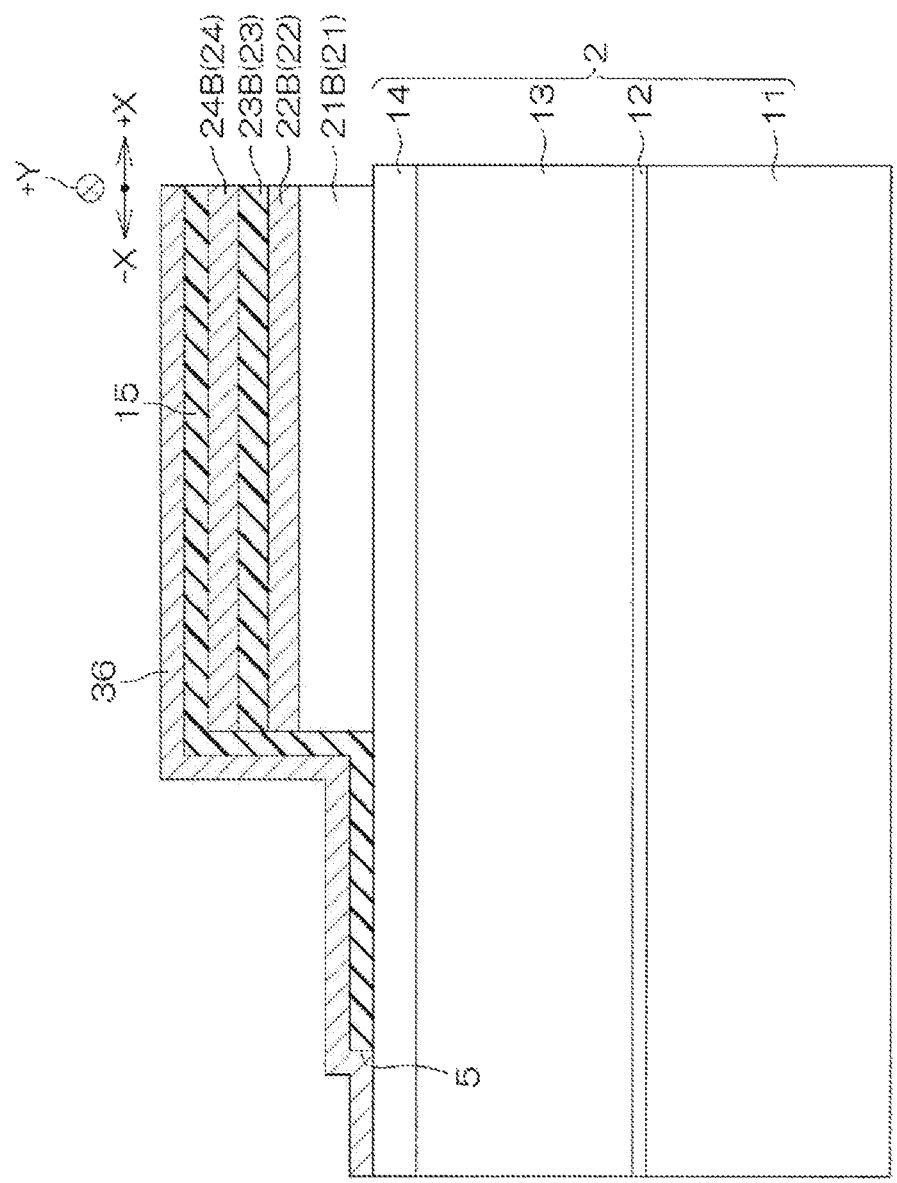

NITRIDE SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2019-101683, filed on May 30, 2019, the entire contents of which are incorporated herein by reference.

TECHNICAL FIELD

The present disclosure relates to a nitride semiconductor device made of a group III nitride semiconductor (hereinafter sometimes simply referred to as "nitride semiconductor") and a method for manufacturing the same.

BACKGROUND

A group III nitride semiconductor is a semiconductor in which nitrogen is used as a group V element in a group III-V semiconductor. Representative examples are aluminum nitride (AlN), gallium nitride (GaN), and indium nitride (InN). Generally, it can be expressed as $Al_xIn_yGa_{1-x-y}N$ ($0 \leq x \leq 1$, $0 \leq y \leq 1$, $0 \leq x+y \leq 1$). A HEMT (High Electron Mobility Transistor) using such a nitride semiconductor has been proposed. Such a HEMT includes, for example, an electron transit layer made of GaN, and an electron supply layer made of AlGaN epitaxially grown on the electron transit layer. A pair of source electrode and drain electrode is formed so as to be in contact with the electron supply layer, and a gate electrode is interposed therebetween.

In the electron transit layer, due to polarization caused by lattice mismatch between GaN and AlGaN, a two-dimensional electron gas is formed at a position several Å inward from an interface between the electron transit layer and the electron supply layer. The source and the drain are connected by using the two-dimensional electron gas as a channel. When the two-dimensional electron gas is cut off by applying a control voltage to the gate electrode, the source and the drain are cut off. When the control voltage is not applied to the gate electrode, since conduction between the source and the drain is established, the device is a normally-on type device.

Since a device using the nitride semiconductor has characteristics such as a high breakdown voltage, high temperature operation, large current density, high speed switching, low on-resistance, and the like, an application to a power device has been proposed in the related art.

In the related art, a configuration is disclosed in which a ridge-shaped p-type GaN gate layer (a nitride semiconductor gate layer) is stacked on an AlGaN electron supply layer, a gate electrode is disposed thereon, and a channel is eliminated by a depletion layer spread from the p-type GaN gate layer, thereby achieving normally-off. The nitride semiconductor device having such a configuration may be referred to as a first comparative example. In the first comparative example, since a gate leakage current flows from the gate electrode to the source electrode via the ridge-shaped p-type GaN gate layer, the gate leakage current may increase. When the gate leakage current is large, sufficient reliability for applying a gate voltage may not be secured, and the gate voltage required to obtain a desired on-resistance may not be secured, or power consumption of a gate drive circuit increases. Such problems may lead to a degradation in efficiency and an increase in heat generation of a power circuit and a control circuit part. This is a major issue for HEMTs that feature high frequency switching.

In the related art, a nitride semiconductor device has been proposed that can reduce a gate leakage current as compared with the first comparative example by forming a gate insulating film on a nitride semiconductor gate layer and forming a gate electrode on the gate insulating film. Such a nitride semiconductor device may be referred to as a second comparative example. In the second comparative example, since an interface level at which electrons enter and exit is formed at an interface between the nitride semiconductor gate layer and the gate insulating film, a threshold voltage may fluctuate.

SUMMARY

Some embodiments of the present disclosure provide a nitride semiconductor device capable of reducing a gate leakage current as compared with the first comparative example and suppressing a fluctuation in threshold voltage as compared with the second comparative example, and a method of manufacturing the same.

According to an embodiment of the present disclosure, there is provided a nitride semiconductor device including: a first nitride semiconductor layer constituting an electron transit layer; a second nitride semiconductor layer formed on the first nitride semiconductor layer and constituting an electron supply layer; a ridge-shaped gate portion formed on the second nitride semiconductor layer; and a source electrode and a drain electrode disposed on the second nitride semiconductor layer so as to face each other with the ridge-shaped gate portion interposed therebetween, wherein the g ridge-shaped ate portion includes: a nitride semiconductor gate layer containing acceptor-type impurities and disposed on the second nitride semiconductor layer; a gate metal film disposed on the nitride semiconductor gate layer; a gate insulating film formed on the gate metal film; and a gate electrode capacitively-coupled to the gate metal film by the gate insulating film.

In this configuration, since the gate insulating film is formed between the nitride semiconductor gate layer and the gate electrode, the gate leakage current can be reduced as compared with the first comparative example. Also in this configuration, an interface level is formed at the interface between the nitride semiconductor gate layer and the gate metal film, and this interface level works to pin (fix) a barrier height, not a level at which electrons enter and exit. For this reason, in this configuration, it is possible to suppress a fluctuation in threshold voltage as compared with the second comparative example.

In some embodiments, the gate insulating film may cover an entire upper surface of the gate metal film in an area where the source electrode and the drain electrode face each other with the ridge-shaped gate portion interposed therebetween, and the gate electrode may cover an entire upper surface of the gate insulating film in the area where the source electrode and the drain electrode face each other with the ridge-shaped gate portion interposed therebetween.

In some embodiments, a side surface of the gate insulating film may be formed on an inclined surface inclined with respect to a surface of the nitride semiconductor gate layer.

In some embodiments, both side edges of the gate metal film may be retreated inward from the corresponding side edges of the nitride semiconductor gate layer in a plan view.

In some embodiments, the nitride semiconductor gate layer may have an extension portion extending outside an area where the source electrode and the drain electrode face each other, and an opening that continuously penetrates the gate electrode and the gate insulating film and exposes the gate metal film may be formed on the extension portion In some embodiments, the nitride semiconductor device may further include a resistor connected between the gate metal film and the gate electrode.

In some embodiments, the nitride semiconductor device may further includes a capacitor connected between the gate metal film and the gate electrode.

In some embodiments, the gate insulating film may be formed of a single film of any one of $SiO_2$, $Al_2O_3$ and $HfO_2$, or a stacked film including any combination of two or more thereof.

In some embodiments, the gate metal film and the gate electrode may be each formed of a single film of any one of Ti, TiN and TiW, or a stacked film including any combination of two or more thereof.

In some embodiments, the gate metal film and the gate electrode may be formed of the same metal film.

In some embodiments, the first nitride semiconductor layer may be formed of a GaN layer, the second nitride semiconductor layer may be formed of an $Al_xGa_{(1-x)}N$ (0<x<1) layer, and the nitride semiconductor gate layer may be formed of a p-type GaN layer.

According to another embodiment of the present disclosure, there is provided a method of manufacturing a nitride semiconductor device, including: forming, on a substrate, a first nitride semiconductor layer constituting an electron transit layer, a second nitride semiconductor layer constituting an electron supply layer, and a semiconductor gate layer material film which is a material film of a nitride semiconductor gate layer containing acceptor-type impurities in sequence; forming, on the semiconductor gate layer material film, a gate metal material film which is a material film of a gate metal film, a gate insulating material film which is a material film of a gate insulating film, and a gate electrode film which is a material film of a gate electrode in sequence; patterning the gate electrode film, the gate insulating material film, the gate metal material film and the semiconductor gate layer material film by etching to form, on the second nitride semiconductor layer, a ridge-shaped gate portion in which the nitride semiconductor gate layer, the gate electrode film, the gate insulating material film and the gate electrode are stacked; forming, on the second nitride semiconductor layer, a passivation film covering exposed surfaces of the ridge-shaped gate portion and the second nitride semiconductor layer; and forming, on both sides of the ridge-shaped gate portion, a source electrode and a drain electrode that penetrate the passivation film and are in ohmic contact with the second nitride semiconductor layer, respectively.

According to this manufacturing method, it is possible to manufacture a nitride semiconductor device capable of reducing a gate leakage current as compared with the first comparative example and suppressing a fluctuation in threshold voltage as compared with the second comparative example.

In some embodiments, the act of patterning may include patterning using a single mask.

In some embodiments, the act of patterning may include at least two etching steps.

In some embodiments, the act of patterning may include: a first etching process of patterning the gate electrode film, the gate insulating material film, and the gate metal material film; and a second etching process of patterning the semiconductor gate layer material film.

In some embodiments, the method further includes between the first etching process and the second etching process: forming a dielectric film on the semiconductor gate layer material film so as to cover exposed surfaces of the gate electrode film, the gate insulating material film, and the gate metal material film and an exposed surface of the semiconductor gate layer material film after the first etching process; and forming a sidewall covering side surfaces of the gate electrode film, the gate insulating material film, and the gate metal material film after the first etching process by anisotropically dry-etching the dielectric film.

BRIEF DESCRIPTION OF DRAWINGS

FIG. 3 is an enlarged cross-sectional view taken along line III-III in FIG. 1.

FIG. 5A is a cross-sectional view showing an example of a process of manufacturing the nitride semiconductor device of FIG. 1, and is a cross-sectional view corresponding to the cut section of FIG. 3.

FIG. 5E is a cross-sectional view showing a process subsequent to FIG. 5D.

DETAILED DESCRIPTION

Figure 1:
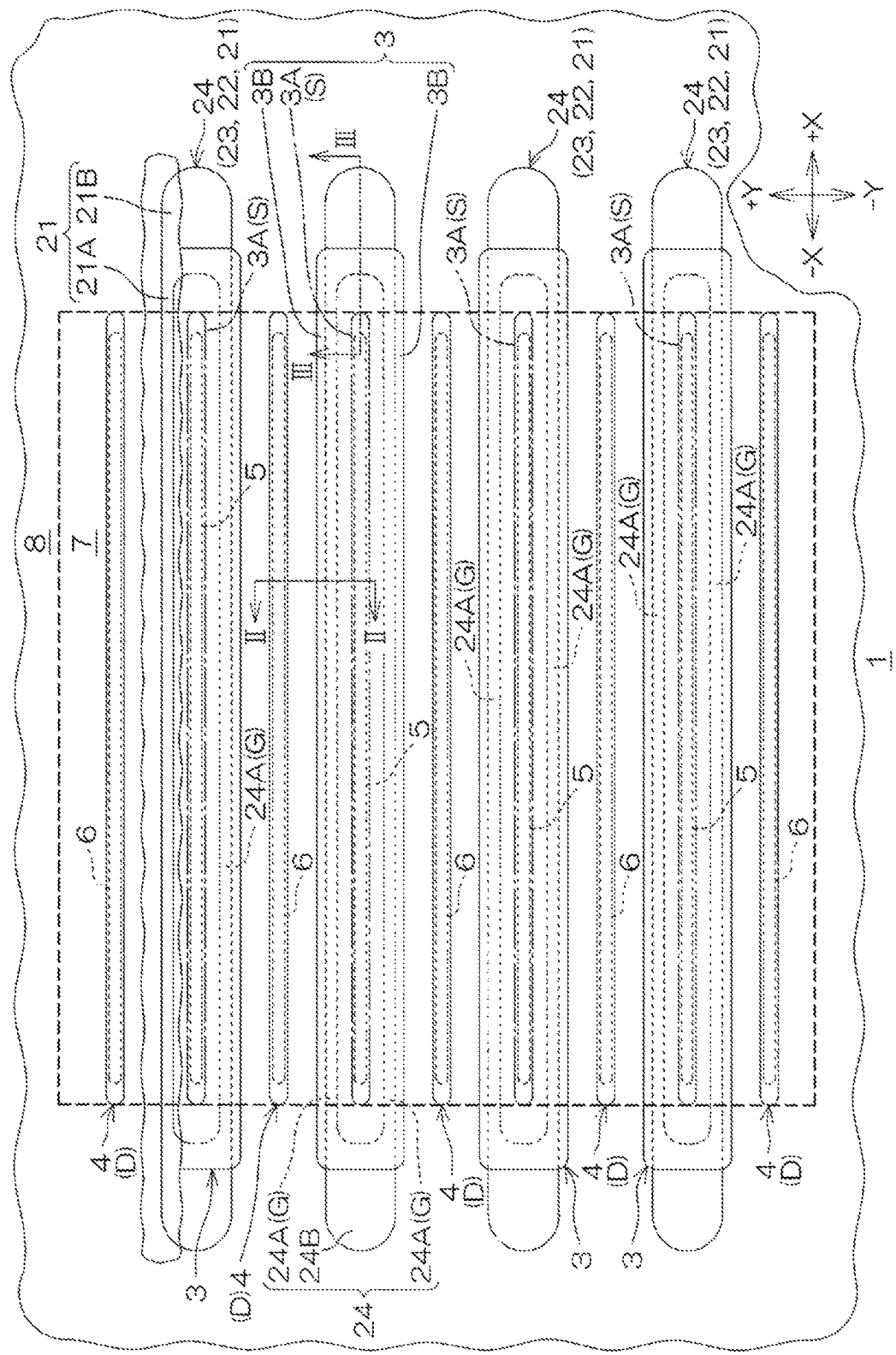
FIG. 1 is a partial plan view for explaining a configuration of a nitride semiconductor device according to a first embodiment of the present disclosure.
Figure 2:
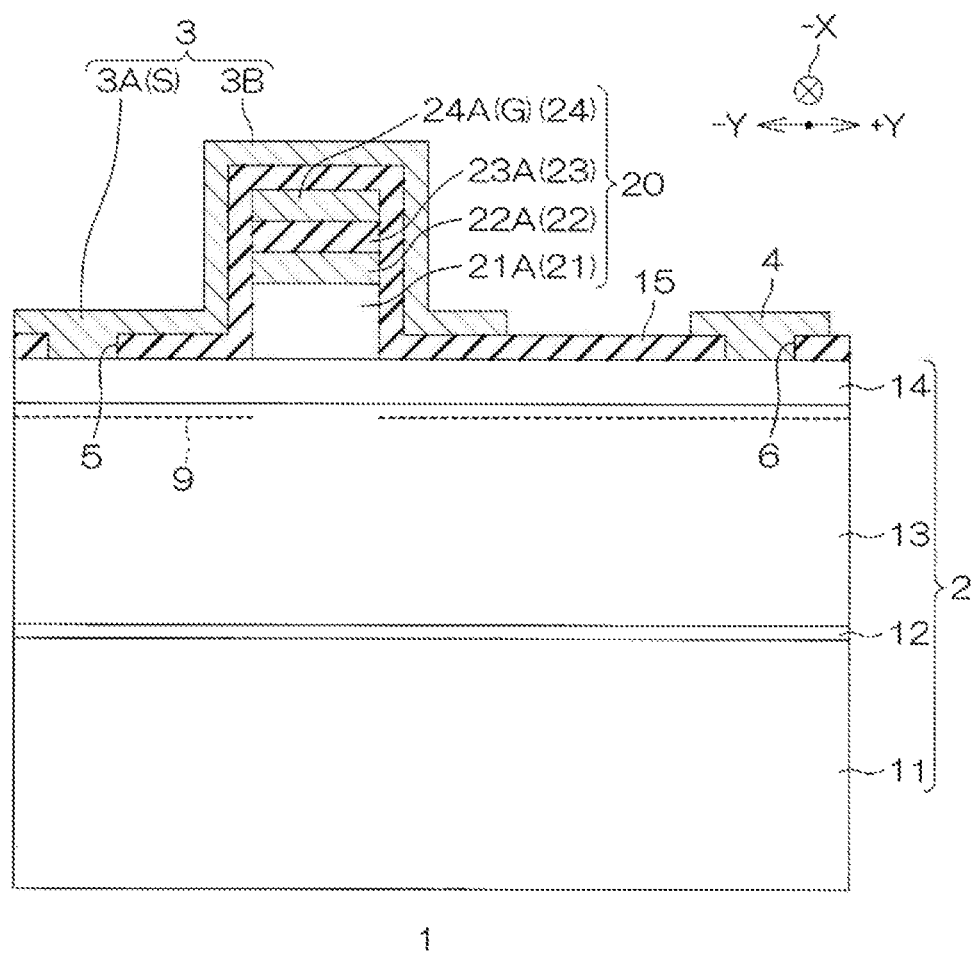
FIG. 2 is an enlarged cross-sectional view taken along line II-II in FIG. 1.

Embodiments of the present disclosure will be now described in detail with reference to the accompanying drawings. FIG. 1 is a partial plan view for explaining a configuration of a nitride semiconductor device according to a first embodiment of the present disclosure. FIG. 2 is an enlarged cross-sectional view taken along line II-II in FIG. 1. FIG. 3 is an enlarged cross-sectional view taken along line III-III in FIG. 1. However, in FIG. 1, a passivation film denoted by reference numeral 15 in FIGS. 2 and 3 is omitted for convenience of description.

For convenience of description, +X direction, −X direction, +Y direction and −Y direction shown in FIGS. 1, 2, and 3 may be used below. The +X direction is a predetermined direction along a surface of the nitride semiconductor device 1 in a plan view, and the +Y direction is a direction along the surface of the nitride semiconductor device 1 and a direction orthogonal to the +X direction. The −X direction is a direction opposite to the +X direction, and the −Y direction is a direction opposite to the +Y direction. The +X direction and the −X direction are collectively and simply referred to as an "X direction." The +Y direction and the −Y direction are collectively and simply referred to as a "Y direction."

A nitride semiconductor device 1 includes a semiconductor multilayer structure 2 and an electrode metal structure arranged on the semiconductor multilayer structure 2. The electrode metal structure includes a plurality of source electrodes 3, a plurality of gate electrodes 24, and a plurality of drain electrodes 4, as shown in FIG. 1. The source electrodes 3 and the drain electrodes 4 extend in the X direction.

Each gate electrode 24 includes a pair of gate main electrode portions 24A extending in parallel with each other in the X direction, and two base portions 24B respectively connecting the corresponding ends of the pair of gate main electrode portions 24A. One source electrode 3 is formed so as to cover the pair of gate main electrode portions 24A of one gate electrode 24 in the plan view. The source electrode 3 includes, in the plan view, a source main electrode portion 3A disposed between longitudinal middle portions of the pair of gate main electrode portions 24A of the gate electrode 24, and an extension portion 3B around the source main electrode portion 3A. In this embodiment, the source main electrode portion 3A refers to an area including an area surrounded by a contour of a source contact hole 5 and a peripheral area thereof in the entire area of the source electrode 3 in the plan view. The extension portion 3B refers to a portion other than the source main electrode portion 3A in the entire area of the source electrode 3 in the plan view.

The extension portion 3B covers a portion of the pair of gate main electrode portions 24A and a portion of the two second base portions 24B of the gate electrode 24 in the plan view.

The drain electrodes 4 are arranged on both sides, respectively, of one source electrode 3. The adjacent drain electrode 4 and source main electrode portion 3A face each other with the gate main electrode portions 24A of the gate electrode 24 interposed therebetween in the plan view. In this embodiment, a length of the drain electrode 4 is substantially equal to a length of the source main electrode portion 3A, and the X-direction positions of both ends of the drain electrode 4 substantially matches the X-direction positions of the corresponding ends of the source main electrode portion 3A.

In the example of FIG. 1, a source main electrode portion 3A(S), a gate main electrode portion 24A(G), and a drain electrode 4(D) are periodically arranged in sequence of DGSGDGS in the Y direction. Thus, an element structure is formed by sandwiching the gate main electrode portion 24A(G) between the source main electrode portion 3A(S) and the drain electrode 4(D). A surface area on the semiconductor multilayer structure 2 includes an active area 7 including the element structure and a non-active area 8 outside the active area 7. A boundary between the active area 7 and the non-active area 8 shown in FIG. 1 is an example, and the present disclosure is not limited thereto.

The base portions 24B of the gate electrode 24 respectively connect the corresponding ends of the pair of gate main electrode portions 24A in the non-active area 8. As shown in FIGS. 2 and 3, the semiconductor multilayer structure 2 includes a substrate 11, a buffer layer 12 formed on a surface of the substrate 11, a first nitride semiconductor layer 13 epitaxially grown on the buffer layer 12, and a second nitride semiconductor layer 14 epitaxially grown on the first nitride semiconductor layer 13.

The substrate 11 may be, for example, a low-resistance silicon substrate. The low-resistance silicon substrate may be, for example, a p-type substrate having an electrical resistivity of 0.001 Ωmm to 0.5 Ωmm (more specifically, about 0.01 Ωmm to 0.1 Ωmm). The substrate 11 may be a low-resistance SiC substrate, a low-resistance GaN substrate, or the like other than the low-resistance silicon substrate. The thickness of the substrate 11 is, for example, about 650 µm during a semiconductor process and is ground to about 300 µm or less in a stage before chip formation. The substrate 11 is electrically connected to the source electrode 3.

In this embodiment, the buffer layer 12 includes a multilayer buffer layer in which a plurality of nitride semiconductor films is stacked. In this embodiment, the buffer layer 12 includes a first buffer layer (not shown) including an AlN film in contact with the surface of the substrate 11, and a second buffer layer (not shown) including an AlN/AlGaN superlattice layer stacked on a surface of the first buffer layer (a surface opposite to the substrate 11). The thickness of the first buffer layer is about 100 nm to 500 nm. The thickness of the second buffer layer is about 500 nm to 2 µm. The buffer layer 12 may include, for example, a single film or a composite film of AlGaN.

The first nitride semiconductor layer 13 forms an electron transit layer. In this embodiment, the first nitride semiconductor layer 13 includes a GaN layer and has a thickness of about 0.5 µm to 2 µm. Further, for the purpose of suppressing a leakage current flowing through the first nitride semiconductor layer 13, impurities for semi-insulating may be introduced into portions other than the surface area. In that case, concentration of the impurities may be $4 \times 10^{16}$ cm$^{-3}$ or more in some embodiments. The impurities are, for example, C or Fe.

The second nitride semiconductor layer 14 forms an electron supply layer. The second nitride semiconductor layer 14 includes a nitride semiconductor having a larger band gap than that of the first nitride semiconductor layer 13. In this embodiment, the second nitride semiconductor layer 14 includes a nitride semiconductor having a higher Al composition than the first nitride semiconductor layer 13. In the nitride semiconductor, the higher the Al composition is, the larger the band gap is. In this embodiment, the second nitride semiconductor layer 14 includes an $Al_{x1}Ga_{1-x1}N$ layer (0<x1<1) and has a thickness of about 5 nm to 25 nm.

In this way, the first nitride semiconductor layer (electron transit layer) 13 and the second nitride semiconductor layer (electron supply layer) 14 include nitride semiconductors having different band gaps (Al compositions) and have a lattice mismatch therebetween. Then, due to spontaneous polarization of the first nitride semiconductor layer 13 and the second nitride semiconductor layer 14 and piezo polarization caused by the lattice mismatch therebetween, an energy level of a conduction band of the first nitride semiconductor layer 13 at an interface between the first nitride semiconductor layer 13 and the second nitride semiconductor layer 14 is lower than the Fermi level. Thus, a two-dimensional electron gas (2DEG) 9 spreads in the first nitride semiconductor layer 13 at a position close to the interface between the first nitride semiconductor layer 13 and the second nitride semiconductor layer 14 (for example, at a distance of about several A from the interface).

A nitride semiconductor gate layer (hereinafter, referred to as a "semiconductor gate layer") 21, a gate metal film 22, and a gate insulating film 23 are interposed between the second nitride semiconductor layer 14 and the gate electrode 24. The semiconductor gate layer 21 is formed on the surface of the second nitride semiconductor layer 14 by epitaxial growth. The semiconductor gate layer 21 has substantially the same shape as the gate electrode 24 in the plan view. Specifically, the semiconductor gate layer 21 includes a pair of ridge portions 21A extending in parallel to each other in the X direction, and two connection portions 21B respectively connecting the corresponding ends of the pair of ridge portions 21A.

The gate metal film 22 is formed on the semiconductor gate layer 21. The gate metal film 22 has substantially the same shape as the gate electrode 24 in the plan view. Specifically, the gate metal film 22 includes a pair of main metal film portions 22A formed on the pair of ridge portions 21A of the semiconductor gate layer 21, and two connection portions 22B formed on the two connection portions 21B of the semiconductor gate layer 21 and respectively connecting the corresponding ends of the pair of main metal film portions 22A.

The gate insulating film 23 is formed on the gate metal film 22. The gate insulating film 23 has substantially the same shape as the gate electrode 24 in the plan view. Specifically, the gate insulating film 23 includes a pair of main insulating film portions 23A formed on the pair of main metal film portions 22A of the gate metal film 22, and two connection portions 23B formed on two connection portions 22B of the gate metal film 22 and respectively connecting the corresponding ends of the pair of main insulating film portions 23A.

The gate electrode 24 is formed on the gate insulating film 23. The pair of gate main electrode portions 24A of the gate electrode 24 is formed on the pair of main insulating film portions 23A of the gate insulating film 23. The two base portions 24B of the gate electrode 24 are formed on the two connection portions 23B of the gate insulating film 23. The semiconductor gate layer 21, the gate metal film 22, the gate insulating film 23, and the gate electrode 24 are each formed in a ring shape in the plan view. As shown in FIG. 2, a ridge-shaped gate portion 20 is formed by the ridge portion 21A of the semiconductor gate layer 21, the main metal film portion 22A formed thereon, the main insulating film portion 23A formed thereon, and the gate main electrode portion 24A(G) formed thereon.

The semiconductor gate layer 21 includes a nitride semiconductor doped with acceptor-type impurities. In this embodiment, the semiconductor gate layer 21 includes a GaN layer (p-type GaN layer) doped with acceptor-type impurities and has a thickness of about 40 nm to 150 nm. The concentration of the acceptor-type impurities implanted into the semiconductor gate layer 21 may be $1 \times 10^{19}$ cm 3 or more in some embodiments. In this embodiment, the acceptor-type impurities are Mg (magnesium). The acceptor-type impurities may be acceptor-type impurities other than Mg, such as Zn (zinc).

The semiconductor gate layer 21 is provided to prevent a two-dimensional electron gas 9 from being generated in an area immediately below the gate portion 20 in a state where the semiconductor gate layer 21 changes the energy level of the conduction band at the interface between the first nitride semiconductor layer 13 and the second nitride semiconductor layer in the area immediately below the gate portion 20 and applies no gate voltage. In this embodiment, the gate metal film 22 includes a TiN layer and has a thickness of about 50 nm to 200 nm. In this embodiment, the thickness of the gate metal film 22 is 100 nm. The gate metal film 22 may include a single film of any one of Ti, TiN, and Tw, or a composite film including any combination of two or more thereof.

The gate insulating film 23 includes $SiO_2$ in this embodiment. The thickness of the gate insulating film 23 is about 10 nm to 30 nm. The thickness of the gate insulating film 23 may be 10 nm or more in some embodiments. In this embodiment, the thickness of the gate insulating film 23 is 30 nm. The gate insulating film 23 may include a single film of anyone of $SiO_2$, $Al_2O_3$ and $HfO_2$, or a composite film including any combination of two or more thereof.

The gate electrode 24 includes a TiN layer in this embodiment and has a thickness of about 50 nm to 200 nm. In this embodiment, the thickness of the gate electrode 24 is 100 nm. The gate electrode 24 may include a single film of any one of Ti, TiN, and TiW, or a composite film including any combination of two or more thereof. As shown in FIGS. 2 and 3, a passivation film 15 covering exposed surfaces of the second nitride semiconductor layer 14, the semiconductor gate layer 21, the gate metal film 22, the gate insulating film 23, and the gate electrode 24 is formed on the second nitride semiconductor layer 14. Therefore, the side surface and the front surface of the gate portion 20 are covered with the passivation film 15. In this embodiment, the passivation film 15 includes a SiN film and has a thickness of about 50 nm to 200 nm. The passivation film 15 may include a single film of any one of SiN, $SiO_2$, and SiON, or a composite film including any combination of two or more thereof.

A source contact hole 5 and a drain contact hole 6 are formed in the passivation film 15. The source contact hole 5 and the drain contact hole 6 are formed so as to sandwich the gate portion 20. The source main electrode portion 3A of the source electrode 3 penetrates the source contact hole 5 and is in ohmic contact with the second nitride semiconductor layer 14. As shown in FIGS. 1 and 2, in the active area 7, the extension portion 3B of the source electrode 3 covers the gate portion 20. As shown in FIGS. 1 and 3, in the non-active area 8, a portion of the extension portion 3B of the source electrode 3 covers a portion of the base portion 24B of the gate electrode 24. The drain electrode 4 penetrates the drain contact hole 6 and is in ohmic contact with the second nitride semiconductor layer 14.

The source electrode 3 and the drain electrode 4 include, for example, a first metal layer (ohmic metal layer) in contact with the second nitride semiconductor layer 14, a second metal layer (main electrode metal layer) stacked on the first metal layer, a third metal layer (adhesion layer) stacked on the second metal layer, and a fourth metal layer (barrier metal layer) stacked on the third metal layer. The first metal layer is, for example, a Ti layer having a thickness of about 10 nm to 20 nm. The second metal layer is, for example, an AlCu layer having a thickness of about 100 nm to 300 nm. The third metal layer is, for example, a Ti layer having a thickness of about 10 nm to 20 nm. The fourth metal layer is, for example, a TiN layer having a thickness of about 10 nm to 50 nm.

In this nitride semiconductor device 1, the second nitride semiconductor layer (electron supply layer) 14 having a different band gap (Al composition) is formed on the first nitride semiconductor layer (electron transit layer) 13 to forma hetero-junction. Thus, the two-dimensional electron gas 9 is formed in the first nitride semiconductor layer 13 near the interface between the first nitride semiconductor layer 13 and the second nitride semiconductor layer 14, and a HEMT is formed using the two-dimensional electron gas 9 as a channel. The gate main electrode portion 24A of the gate electrode 24 faces the second nitride semiconductor layer 14 with the ridge portion 21A of the semiconductor gate layer 21 interposed therebetween.

Below the gate main electrode portion 24A, the energy levels of the first nitride semiconductor layer 13 and the second nitride semiconductor layer 14 are raised by ionization acceptors included in the ridge portion 21A composed of a p-type GaN layer. Therefore, the energy level of the conduction band at the hetero-junction interface between the first nitride semiconductor layer 13 and the second nitride semiconductor layer 14 is higher than the Fermi level. Therefore, immediately below the gate main electrode portion 24A (the gate portion 20), a two-dimensional electron gas 9 due to the spontaneous polarization of the first nitride semiconductor layer 13 and the second nitride semiconductor layer 14 and the piezo polarization by their lattice mismatch is not formed.

Therefore, when no bias is applied to the gate electrode 24 (zero bias), the channel by the two-dimensional electron gas 9 is cut off immediately below the gate main electrode portion 24A. Thus, a normally-off type HEMT is realized. When an appropriate on-voltage (for example, 5V) is applied to the gate electrode 24, a channel is induced in the first nitride semiconductor layer 13 immediately below the gate main electrode portion 24A, and the two-dimensional electron gas 9 on both sides of the gate main electrode portion 4A is connected. Thus, conduction between the source and the drain is established.

When in use, for example, a predetermined voltage (for example, 50V to 100V) is applied between the source electrode 3 and the drain electrode 4 such that the drain electrode 4 side is positive. In this state, an off voltage (0V) or an on voltage (5V) is applied to the gate electrode 24 with the source electrode 3 as the reference potential (0V). FIGS. 4A to 4E and FIGS. 5A to 5E are cross-sectional views for explaining an example of a process of manufacturing the above-described nitride semiconductor device 1, showing cross-sectional structures at a plurality of steps in the manufacturing process. FIGS. 4A to 4E are cross-sectional views corresponding to the cut section of FIG. 2, and FIGS. 5A to 5E are cross-sectional views corresponding to the cut section of FIG. 3.

Figure 4A:
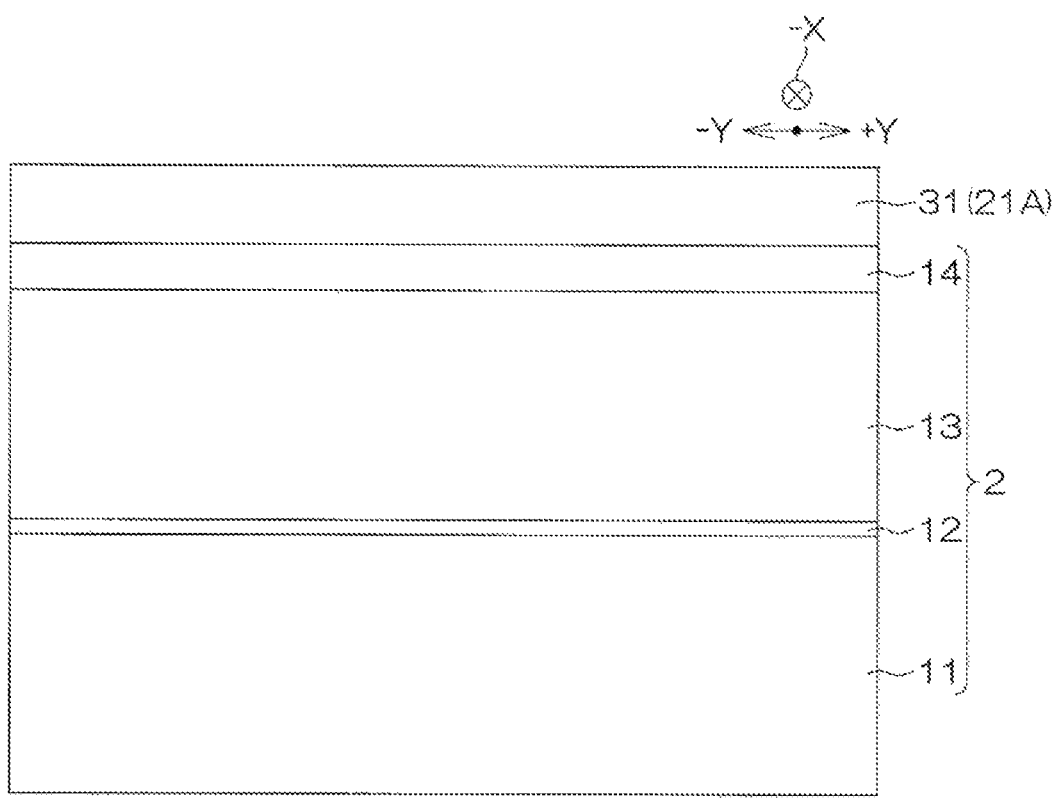
FIG. 4A is a cross-sectional view showing an example of a process of manufacturing the nitride semiconductor device of FIG. 1, and is a cross-sectional view corresponding to the cut section of FIG. 2.

First, as shown in FIGS. 4A and 5A, the buffer layer 12, the first nitride semiconductor layer 13, and the second nitride semiconductor layer 14 are epitaxially grown on the substrate 11 by a MOCVD (Metal Organic Chemical Vapor Deposition) method. Thus, the semiconductor multilayer structure 2 is obtained. Further, agate layer material film 31, which is a material film of the semiconductor gate layer 21, is formed on the second nitride semiconductor layer 14 by the MOCVD method. In this embodiment, the gate layer material film 31 is a p-type GaN film.

Figure 4B:
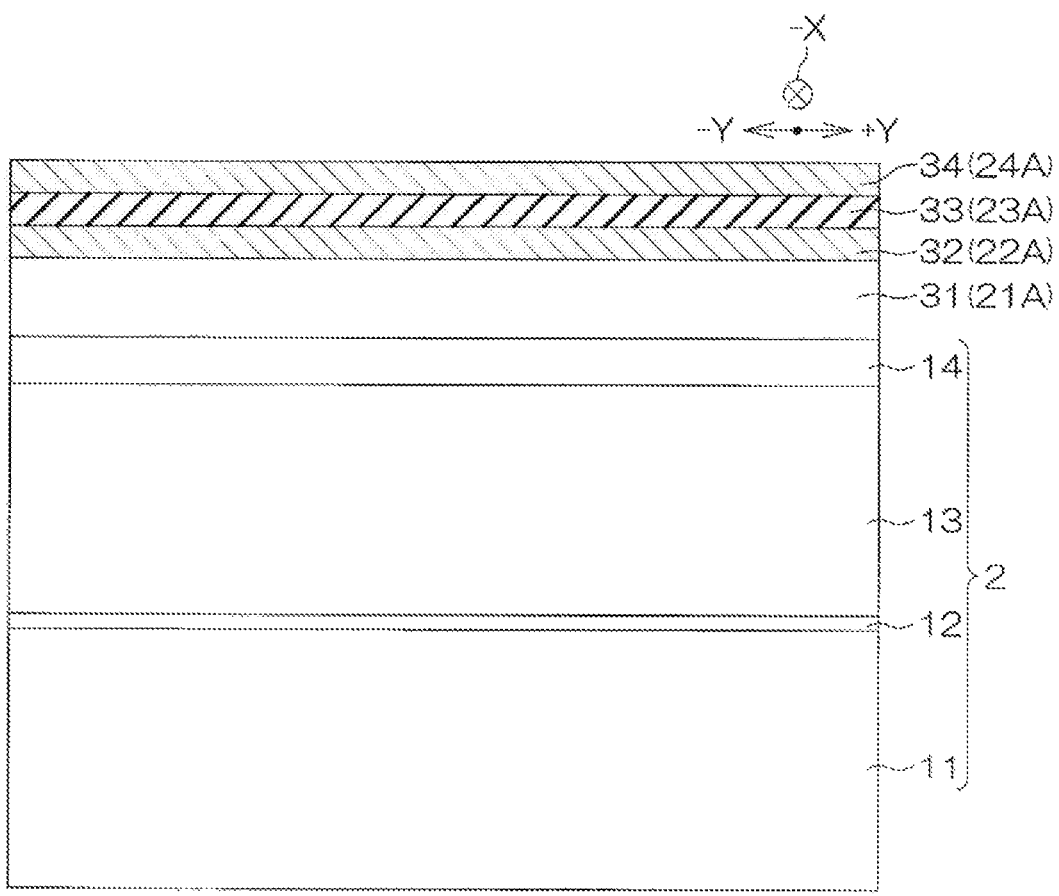
FIG. 4B is a cross-sectional view showing a process subsequent to FIG. 4A.
Figure 5B:
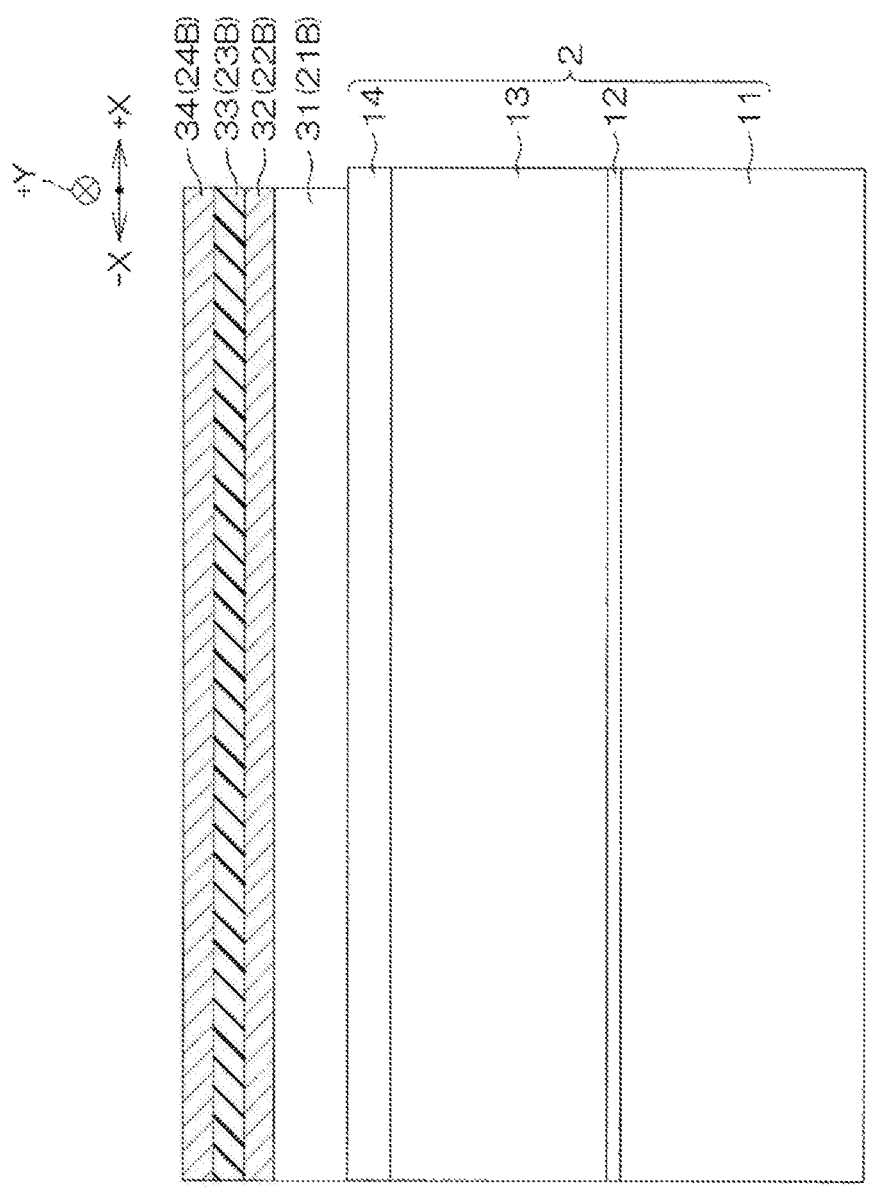
FIG. 5B is a cross-sectional view showing a process subsequent to FIG. 5A.

Next, as shown in FIGS. 4B and 5B, a gate metal material film 32, which is a material film of the gate metal film 22, is formed on the gate layer material film 31 by a sputtering method or a vapor deposition method. The gate metal material film 32 includes, for example, a metal film of TiN. Next, agate insulating material film 33, which is a material film of the gate insulating film 23, is formed on the gate metal material film 32. When the gate insulating film 23 is made of $SiO_2$ as in the above-described embodiment, the gate insulating material film 33 can be formed on the gate metal material film 32 by a plasma CVD, an LPCVD (Low Pressure CVD) method, an ALD (Atomic Layer Deposition) method, or the like.

Figure 4C:
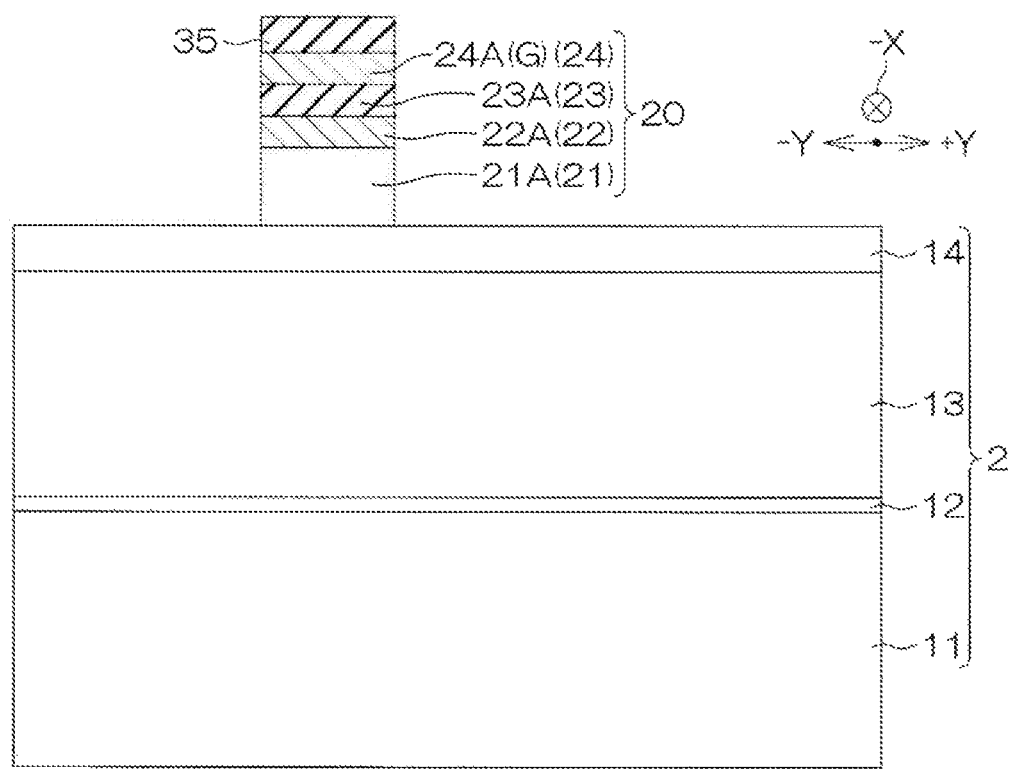
FIG. 4C is a cross-sectional view showing a process subsequent to FIG. 4B.
Figure 5C:
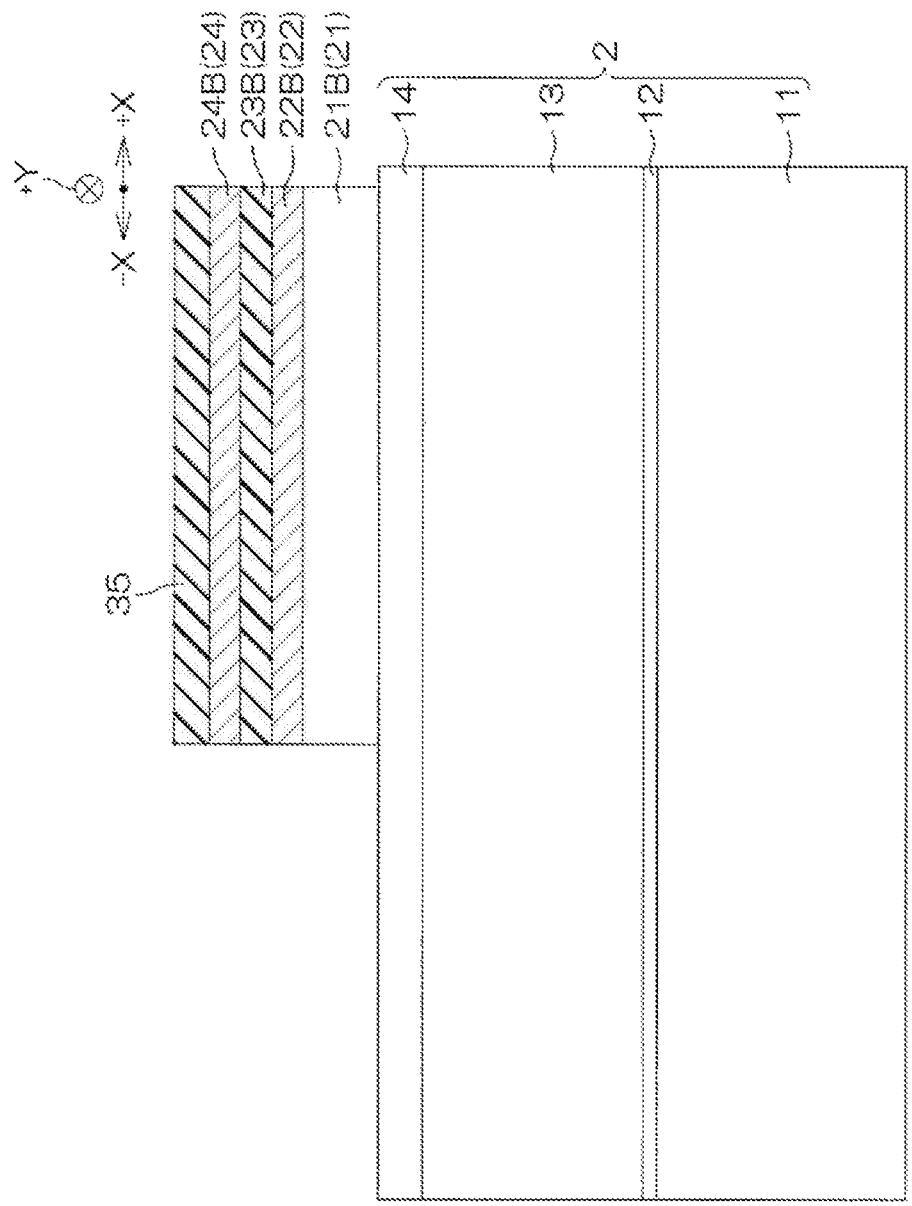
FIG. 5C is a cross-sectional view showing a process subsequent to FIG. 5B.

Thereafter, a gate electrode film 34, which is a material film of the gate electrode 24, is formed on the gate insulating material film 33 by the sputtering method or the vapor deposition method. The gate electrode film 34 includes, for example, a metal film of TiN. Next, as shown in FIGS. 4C and 5C, a resist film 35 covering an area where the gate electrode is to be formed on the surface of the gate electrode film 34 is formed by photolithography. Then, using the resist film 35 as a mask, the gate electrode film 34, the gate insulating material film 33, the gate metal material film 32, and the gate layer material film 31 are selectively etched.

Thus, the gate electrode film 34 is patterned to obtain the gate electrode 24. Further, the gate insulating material film 33, the gate metal material film 32, and the gate layer material film 31 are patterned into the same pattern as the gate electrode 24 to obtain the gate insulating film 23, the gate metal film 22, and the semiconductor gate layer 21. The semiconductor gate layer 21 includes the ridge portion 21A and the connection portion 21B. The gate metal film 22 includes the main metal film portion 22A formed on the ridge portion 21A, and the connection portion 22B formed on a connection portion 15B. The gate insulating film 23 includes the main insulating film portion 23A formed on the main metal film portion 22A, and the connection portion 23B formed on the connection portion 22B. The gate electrode 24 includes the gate main electrode portion 24A formed on the main insulating film portion 23A, and the base portion 24B formed on the connection portion 23B. Thus, the gate portion 20 including the ridge portion 21A, the main metal film portion 22A, the main insulating film portion 23A, and the gate main electrode portion 24A is obtained.

Figure 4D:
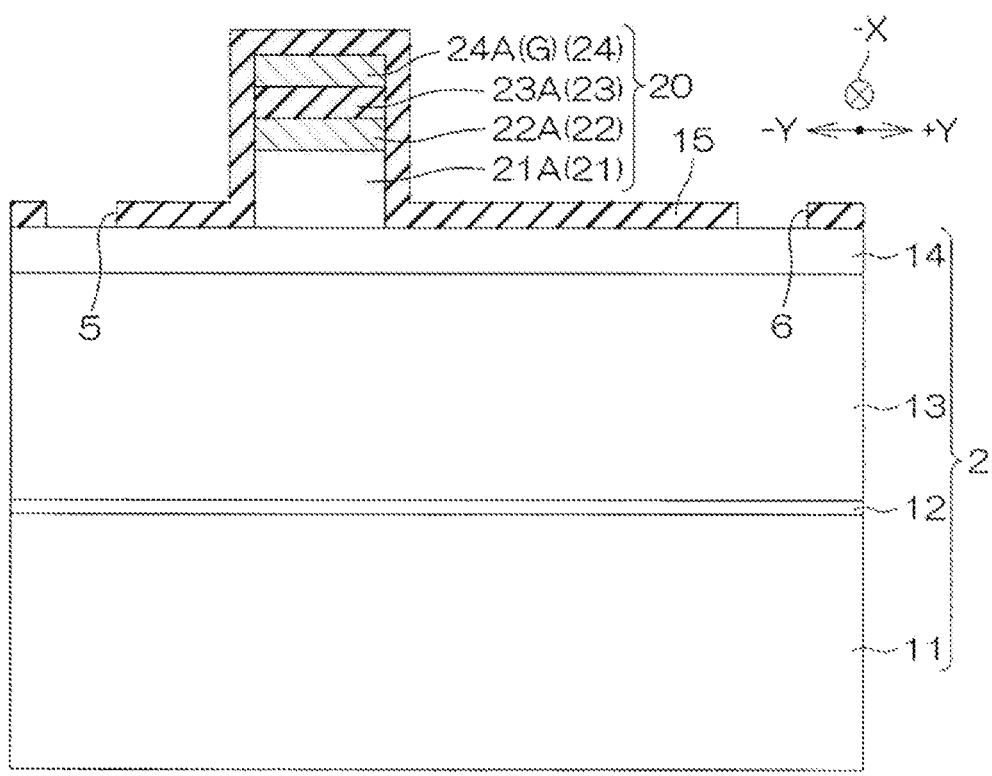
FIG. 4D is a cross-sectional view showing a process subsequent to FIG. 4C.
Figure 5D:
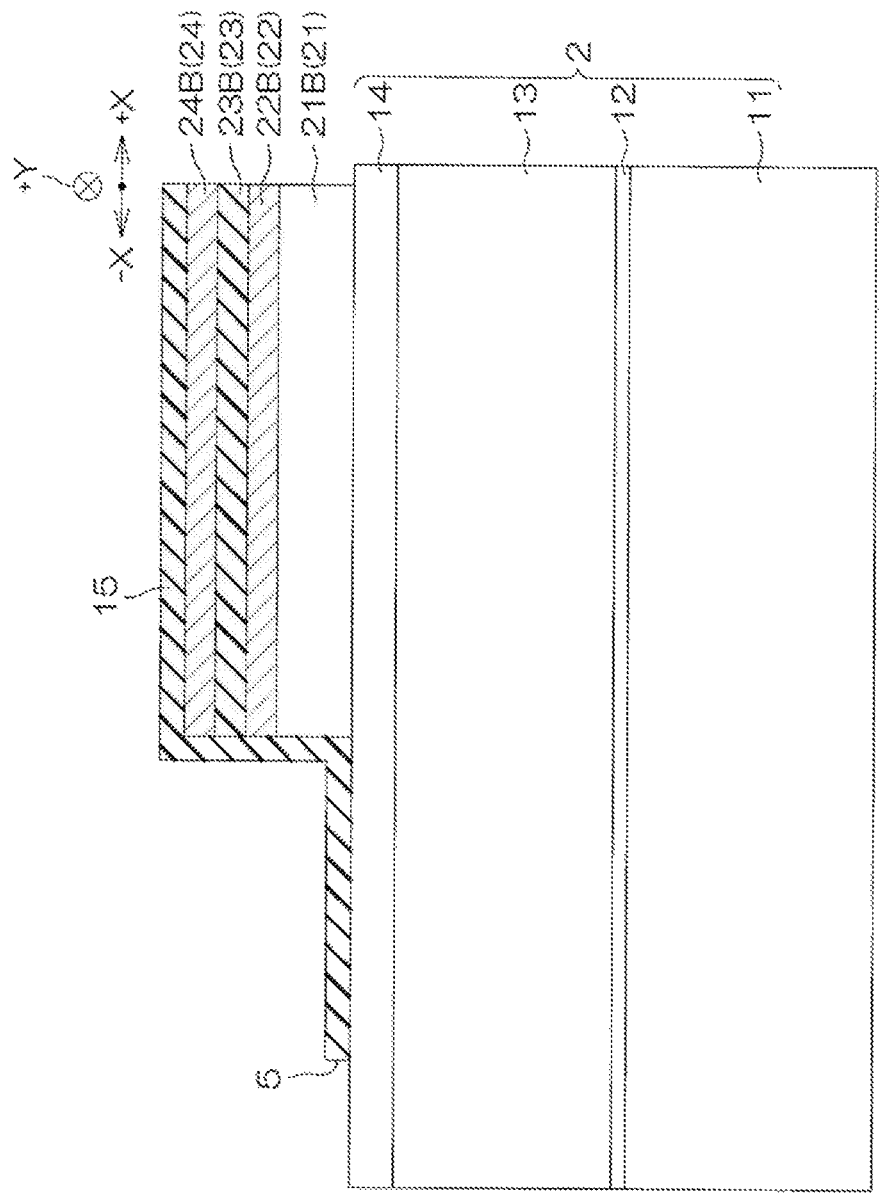
FIG. 5D is a cross-sectional view showing a process subsequent to FIG. 5C.

Next, the resist film 35 is removed. Thereafter, as shown in FIGS. 4D and 5D, the passivation film 15 is formed so as to cover the entire exposed surface. The passivation film 15 is made of, for example, SiN. Then, the source contact hole 5 and the drain contact hole 6 reaching the second nitride semiconductor layer 14 are formed in the passivation film 15.

Figure 4E:
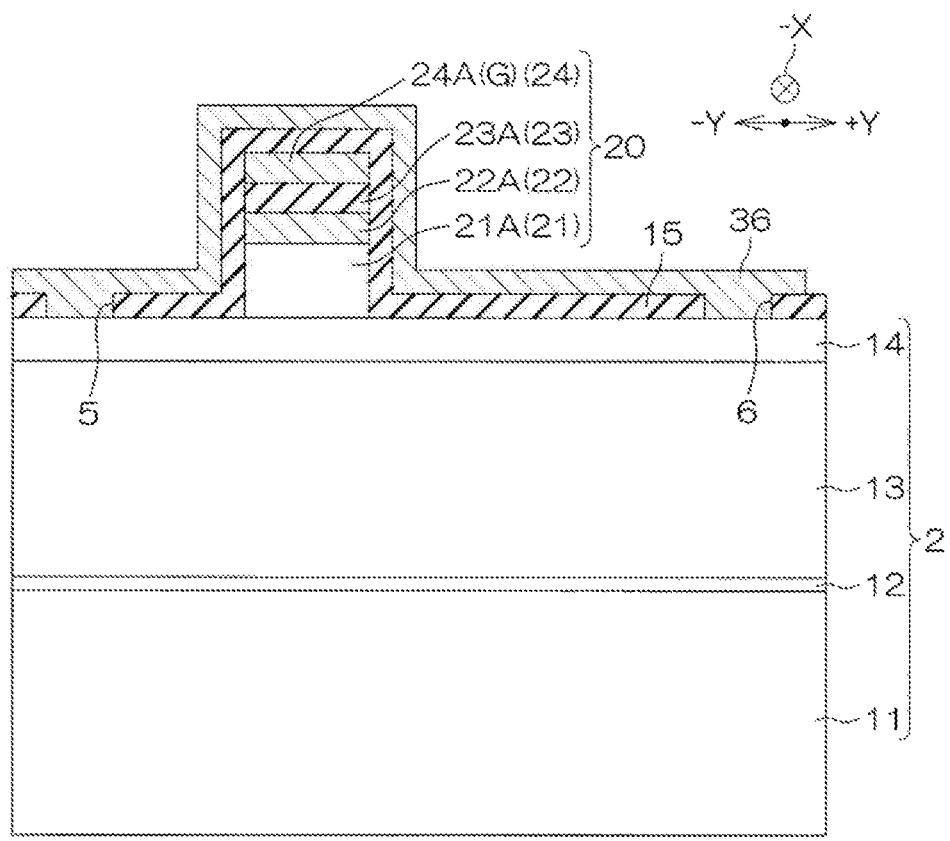
FIG. 4E is a cross-sectional view showing a process subsequent to FIG. 4D.

Next, as shown in FIGS. 4E and 5E, a source/drain electrode film 36 is formed so as to cover the entire exposed surface. Finally, by patterning the source/drain electrode film 36 by photolithography and etching, the source electrode 3 and the drain electrode 4, which are in ohmic contact with the second nitride semiconductor layer 14, are formed. Thus, the nitride semiconductor device 1 having the structure as shown in FIGS. 1 to 3 is obtained.

Figure 6:
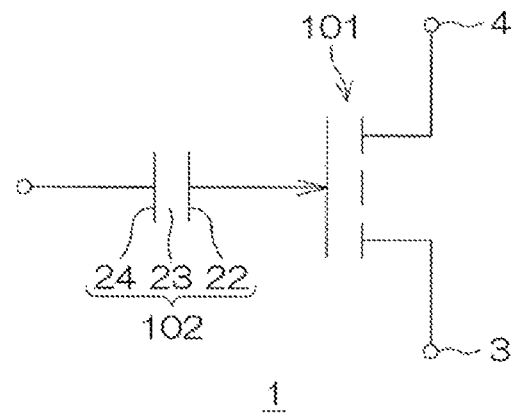
FIG. 6 is an electric circuit diagram showing an internal electrical structure of the nitride semiconductor device of FIG. 1.

FIG. 6 is an electric circuit diagram showing the internal electrical structure of the nitride semiconductor device 1. The nitride semiconductor device 1 includes a HEMT 101. The drain electrode 4 is connected to the drain of the HEMT 101. The source electrode 3 is connected to the source of the HEMT 101. A capacitor 102 including the gate metal film 22, the gate insulating film 23, and the gate electrode 24 is connected to the gate of the HEMT 101.

A nitride semiconductor device having a configuration in which the nitride semiconductor device 1 of FIGS. 1 to 3 is not provided with the gate metal film 22 and the gate insulating film 23 is referred to as a first comparative example. That is, in the first comparative example, the gate portion 20 includes the ridge portion 21A of the semiconductor gate layer 21 formed on the second nitride semiconductor layer 14, and the gate main electrode portion 24A formed so as to be in contact with the surface of the ridge portion 21A.

A nitride semiconductor device having a configuration in which the nitride semiconductor device 1 of FIG. 1 is not provided with the gate metal film 22 is referred to as a second comparative example. That is, in the second comparative example, the gate portion 20 includes the ridge portion 21A of the semiconductor gate layer 21 formed on the second nitride semiconductor layer 14, the main insulating film portion 23A formed so as to be in contact with the surface of the ridge portion 21A, and the gate main electrode portion 24A formed so as to be in contact with the surface of the main insulating film portion 23A.

In the first comparative example, since a gate leakage current flows from the gate electrode 24 to the source electrode 3 via the semiconductor gate layer 21, the gate leakage current may increase. In the second comparative example, since the gate insulating film 23 is interposed between the semiconductor gate layer 21 and the gate electrode 24, the gate leakage current can be reduced as compared with the first comparative example. However, in the second comparative example, since an interface level at which electrons enter and exit is formed at the interface between the semiconductor gate layer 21 and the gate insulating film 23 (semiconductor/insulating film interface), a threshold voltage may fluctuate.

In the nitride semiconductor device 1 according to the first embodiment, as in the second comparative example, since the gate insulating film 23 is interposed between the semiconductor gate layer 21 and the gate electrode 24, the gate leakage current can be reduced as compared with the first comparative example. Even in the nitride semiconductor device 1 according to the first embodiment, an interface level is formed at an interface between the semiconductor gate layer 21 and the gate metal film 22 (semiconductor/ metal film interface). This interface level works to pin (fix) the barrier height, not a level at which electrons enter and exit. For this reason, in the nitride semiconductor device 1 according to the first embodiment, it is possible to suppress the fluctuation of the threshold voltage as compared with the second comparative example.

Further, since the nitride semiconductor device 1 according to the first embodiment includes the capacitor including the gate metal film 22, the gate insulating film 23, and the gate electrode 24, a wiring path for connecting the capacitor can be shortened as compared with a case where the capacitor as an external element is connected to a gate control circuit. Therefore, the parasitic inductance of the gate control circuit can be reduced. Thus, a surge voltage generated between the gate and the source can be reduced.

Figure 7:
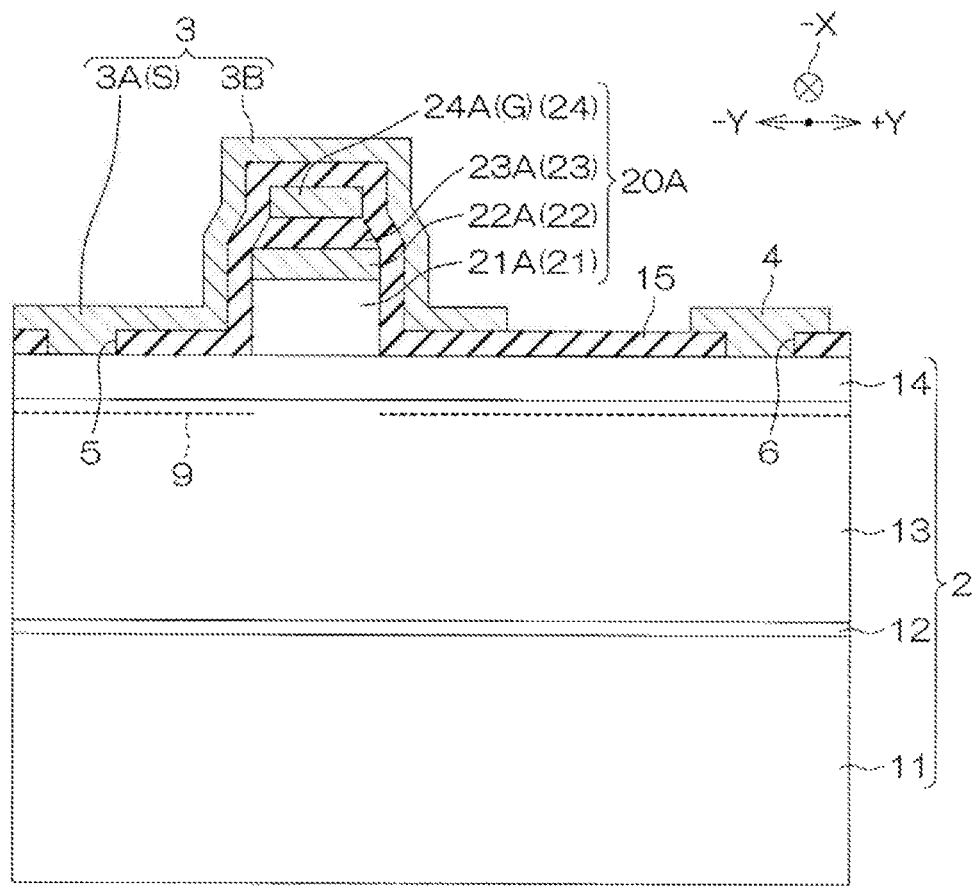
FIG. 7 is a cross-sectional view for explaining a first modification of a gate portion, and is a cross-sectional view corresponding to FIG. 2.
Figure 8:
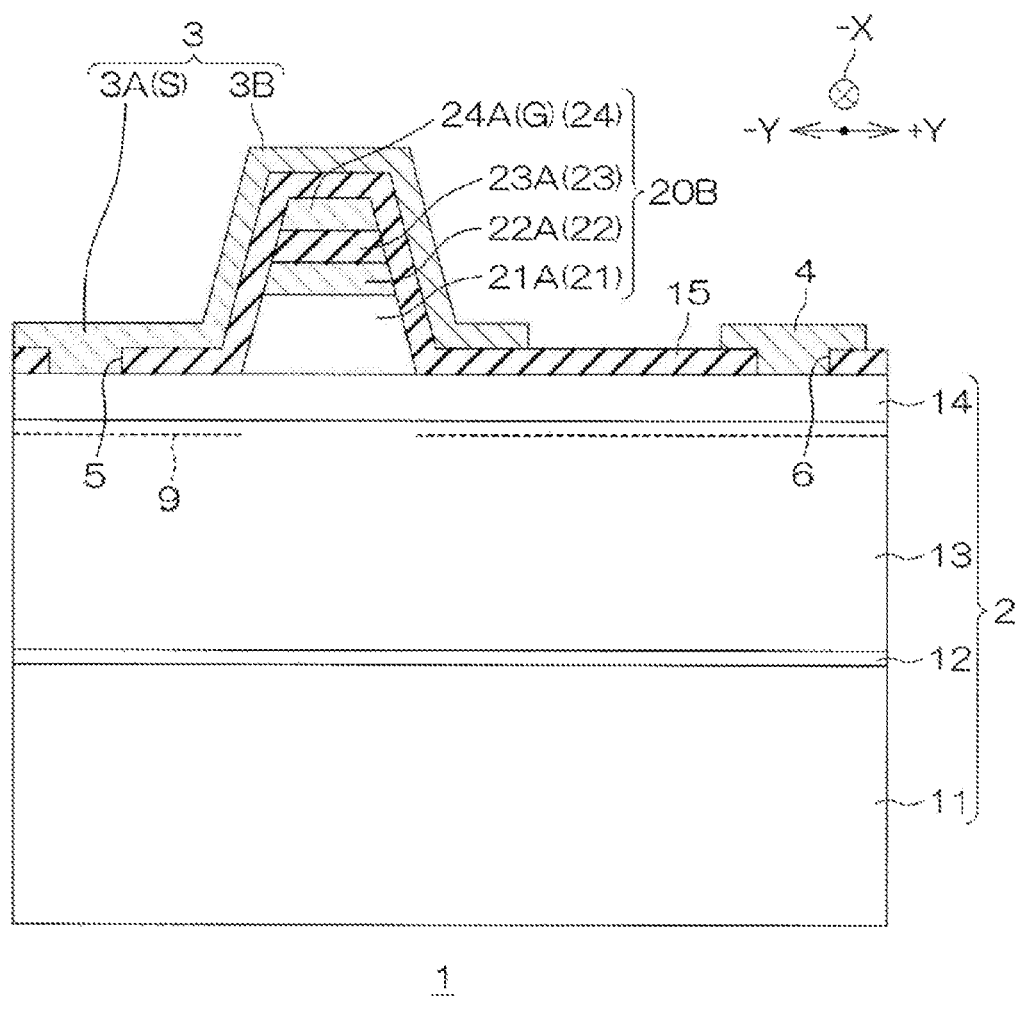
FIG. 8 is a cross-sectional view for explaining a second modification of the gate portion, and is a cross-sectional view corresponding to FIG. 2.
Figure 9:
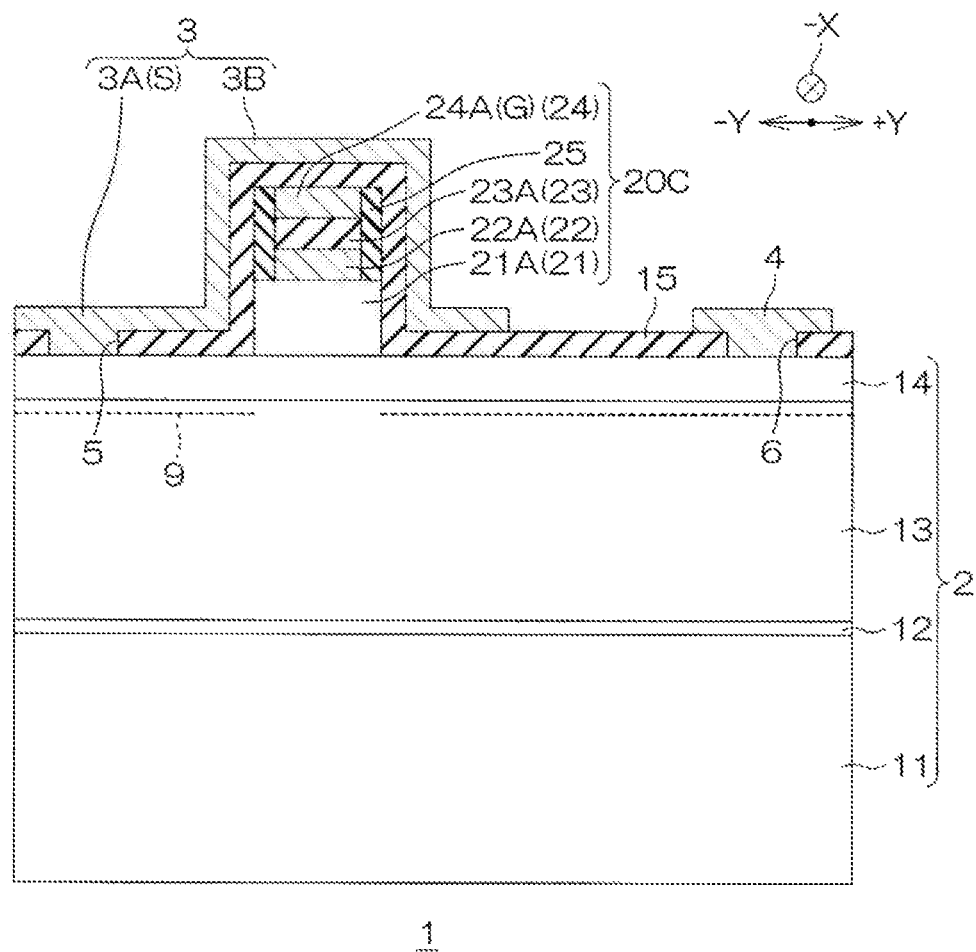
FIG. 9 is a cross-sectional view for explaining a third modification of the gate portion, and is a cross-sectional view corresponding to FIG. 2.

FIGS. 7, 8, and 9 are cross-sectional views for explaining first, second, and third modifications, respectively, of the gate portion, and are cross-sectional views corresponding to FIG. 2. In FIGS. 7, 8 and 9, parts corresponding to the respective parts in FIG. 2 described above are denoted by the same reference numerals as in FIG. 2. Referring to FIG. 7, a gate portion 20A of the first modification is different from the gate portion 20 of the first embodiment in that the cross-sectional shape of the main insulating film portion 23A in the gate portion 20A is an isosceles trapezoidal shape in which the width of the gate insulating film 23 decreases toward the upper side. Thus, both side surfaces of the gate insulating film 23 are formed on inclined surfaces. The gate electrode 24 is formed on the entire upper surface of the gate insulating film 23.

In the first modification, a distance between both side edges of the lower surface of the gate main electrode portion 24A of the gate electrode 24 and the corresponding side edge of the upper surface of the main metal film portion 22A of the gate metal film 22 is longer than that in the first embodiment. Therefore, in the first modification, the gate leakage current can be further reduced as compared with the first embodiment. Referring to FIG. 8, a gate portion 20B of the second modification is different from the gate portion 20 of the first embodiment in that the entire cross-sectional shape of the gate portion 20B is an isosceles trapezoidal shape. In the gate portion 20B of the second modification, similarly to the first modification, a distance between both side edges of the lower surface of the gate main electrode portion 24A of the gate electrode 24 and the corresponding side edge of the upper surface of the main metal film portion 22A of the gate metal film 22 is longer than that of the gate portion 20 of the first embodiment. Therefore, in the second modification, the gate leakage current can be further reduced as compared with the first embodiment.

Referring to FIG. 9, in a gate portion 20C of the third modification, the main metal film portion 22A of the gate metal film 22 is formed on an intermediate portion in a width of the semiconductor gate layer 21 except for both sides on the upper surface of the ridge portion 21A. Therefore, in the plan view, both side edges of the lower surface of the main metal film portion 22A are recessed inward with respect to the corresponding side edges of the upper surface of the ridge portion 21A. The main insulating film portion 23A of the gate insulating film 23 is formed on the entire upper surface of the main metal film portion 22A. The gate main electrode portion 24A of the gate electrode 24 is formed on the entire upper surface of the main insulating film portion 23A. Then, sidewalls 25 covering both side surfaces of the stacked film and the upper surfaces of both sides of the upper surface of the ridge portion 21A are formed on both sides of the stacked film of the main metal film portion 22A, the main insulating film portion 23A, and the main insulating film portion 23A.

Each sidewall 25 includes, for example, SiN. Each sidewall 25 may include a single film of any one of SiN, $SiO_2$, and SiON, or a composite film including any combination of two or more thereof. In the third modification, since the distance between both side edges of the lower surface of the main metal film portion 22A and the corresponding side edge of the upper surface of the ridge portion 21A is longer than that of the gate portion 20 of the first embodiment, the gate leakage current can be further reduced.

Figure 10A:
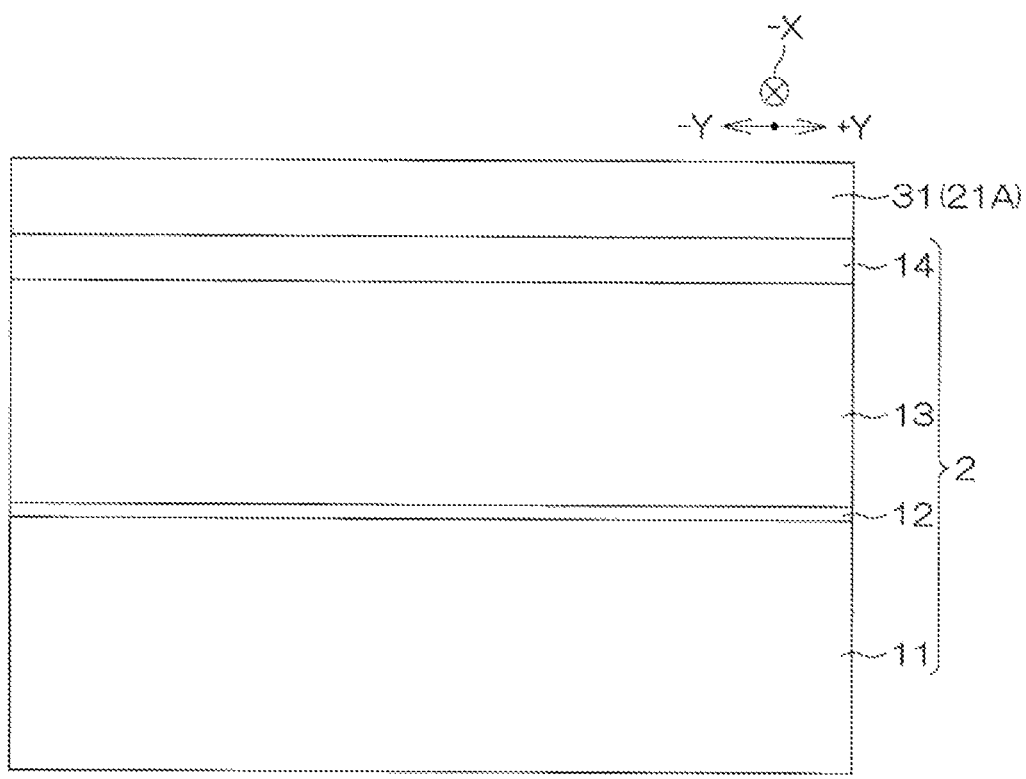
FIG. 10A is a cross-sectional view for explaining an example of a process of manufacturing the nitride semiconductor device of FIG. 9.

FIGS. 10A to 10H are cross-sectional views for explaining an example of a process of manufacturing the nitride semiconductor device 1 including the gate portion 20C of the third modification, showing the cross-sectional structure at a plurality of stages in the manufacturing process. First, as shown in FIG. 10A, the buffer layer 12, the first nitride semiconductor layer 13 and the second nitride semiconductor layer 14 are epitaxially grown on the substrate 11 by a MOCVD (Metal Organic Chemical Vapor Deposition) method. Thus, the semiconductor multilayer structure 2 is obtained. Further, agate layer material film 31, which is a material film of the semiconductor gate layer 21, is formed on the second nitride semiconductor layer 14 by the MOCVD method. In this embodiment, the gate layer material film 31 is a p-type GaN film.

Figure 10B:
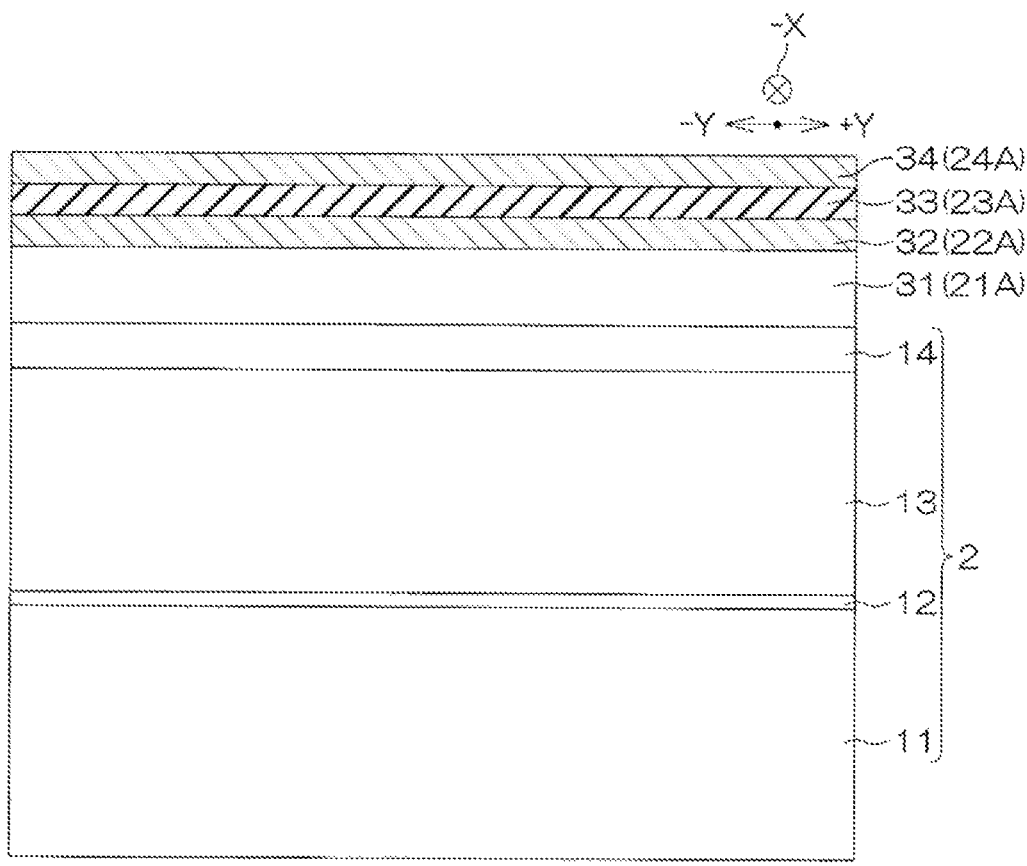
FIG. 10B is a cross-sectional view showing a process subsequent to FIG. 10A.

Next, as shown in FIG. 10B, a gate metal material film 32, which is a material film of the gate metal film 22, is formed on the gate layer material film 31 by the sputtering method or a vapor deposition method. The gate metal material film 32 includes, for example, a metal film of TiN. Next, a gate insulating material film 33, which is a material film of the gate insulating film 23, is formed on the gate metal material film 32. When the gate insulating film 23 includes $SiO_2$ as in the above-described embodiment, the gate insulating material film 33 can be formed on the gate metal material film 32 by a plasma CVD method, a LPCVD (Low Pressure CVD) method, an ALD (Atomic Layer Deposition) method, or the like.

Figure 10C:
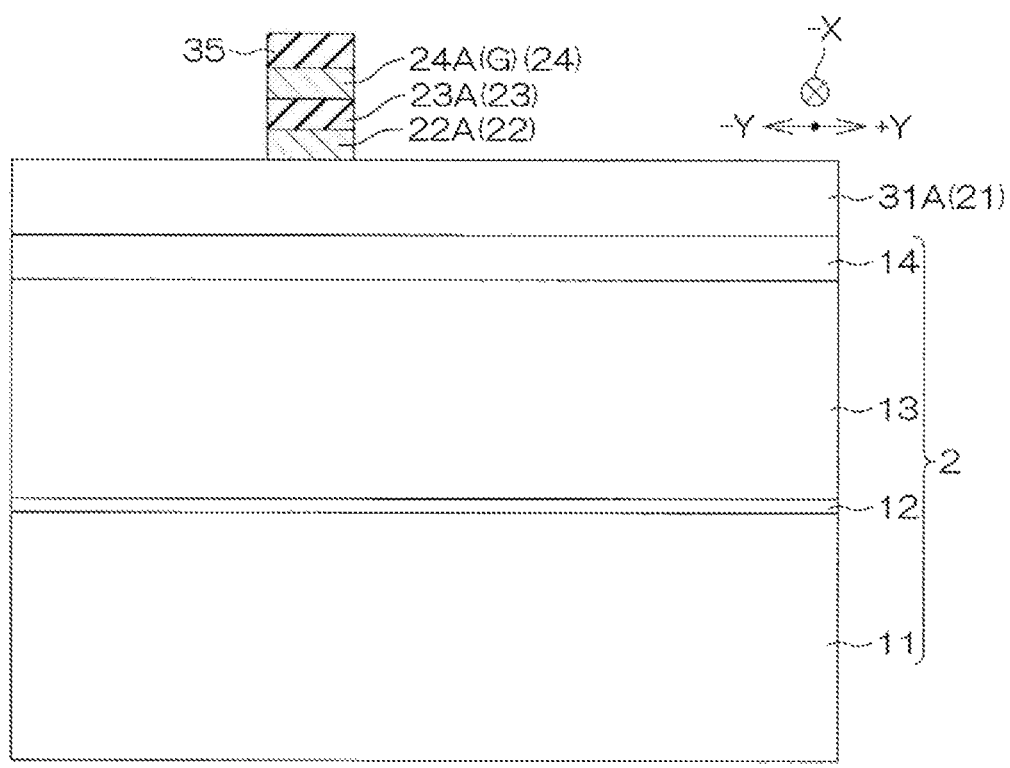
FIG. 10C is a cross-sectional view showing a process subsequent to FIG. 10B.

Thereafter, a gate electrode film 34, which is a material film of the gate electrode 24, is formed on the gate insulating material film 33 by the sputtering method. The gate electrode film 34 includes, for example, a metal film of TiN. Next, as shown in FIG. 10C, a resist film 35 covering an area where the gate electrode is to be formed on the surface of the gate electrode film 34 is formed by photolithography. Then, using the resist film 35 as a mask, the gate electrode film 34, the gate insulating material film 33, and the gate metal material film 32 are selectively etched.

Thus, the gate electrode film 34 is patterned to obtain the gate electrode 24. Further, the gate insulating material film 33 and the gate metal material film 32 are patterned into the same pattern as the gate electrode 24 to obtain the gate insulating film 23 and the gate metal film 22. The gate metal film 22 includes the main metal film portion 22A and the connection portion 22B. The gate insulating film 23 includes the main insulating film portion 23A formed on the main metal film portion 22A, and the connection portion 23B formed on the connection portion 22B. The gate electrode 24 includes the gate main electrode portion 24A formed on the main insulating film portion 23A, and the base portion 24B formed on the connection portion 23B.

Figure 10D:
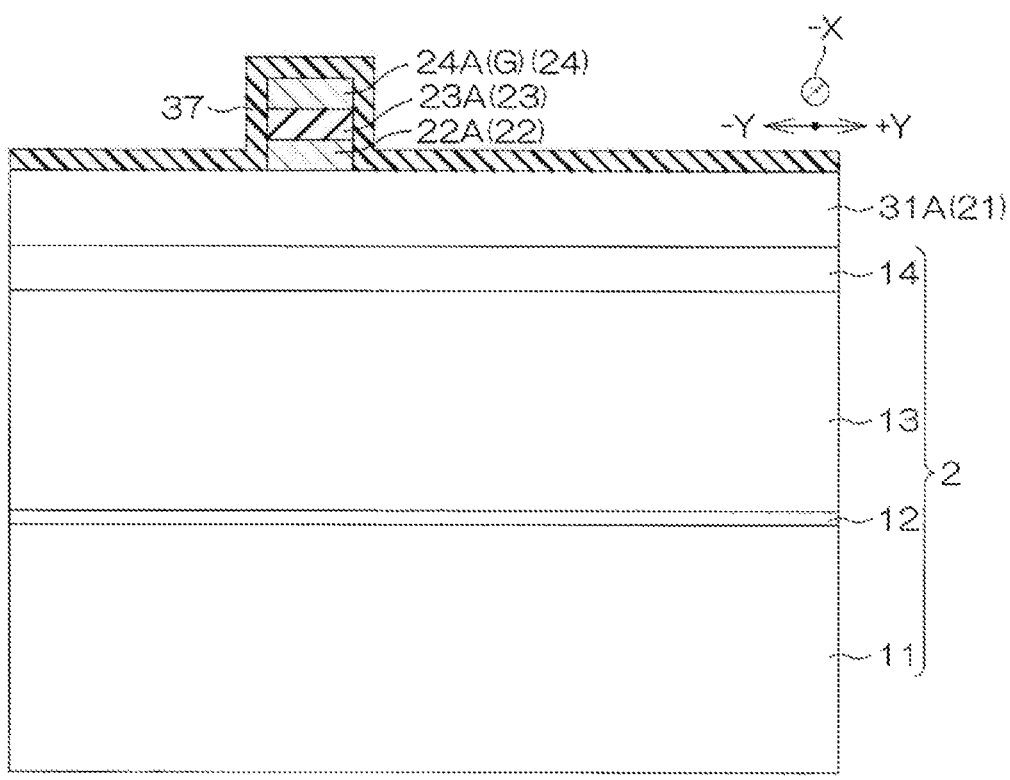
FIG. 10D is a cross-sectional view showing a process subsequent to FIG. 10C.
Figure 10E:
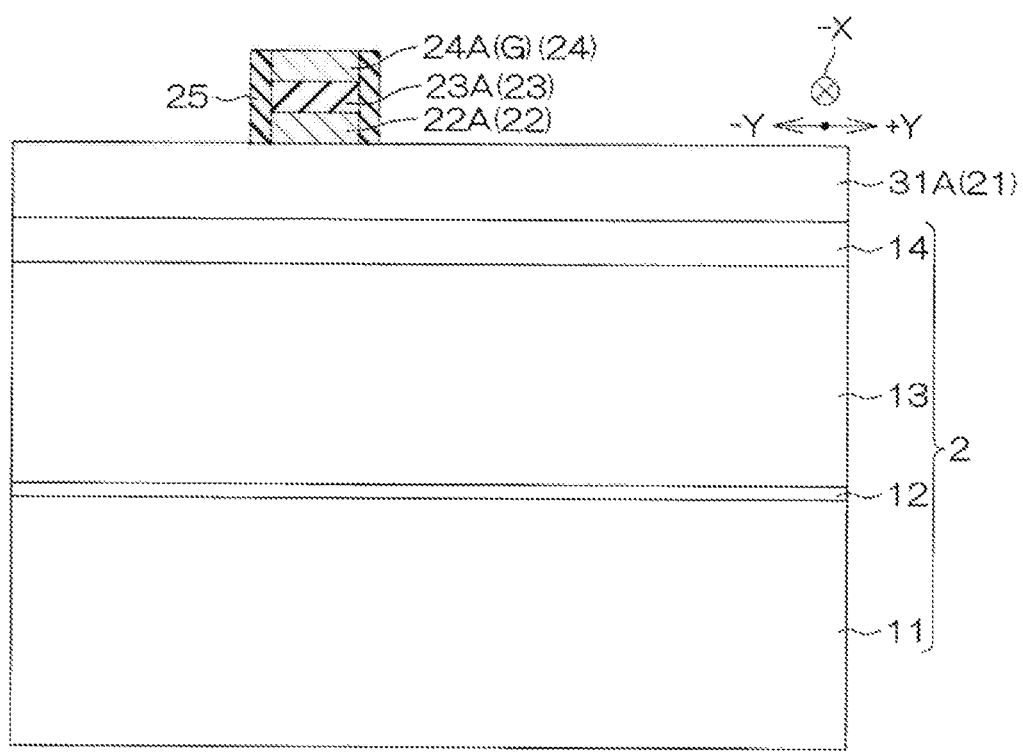
FIG. 10E is a cross-sectional view showing a process subsequent to FIG. 10D.

Next, the resist film 35 is removed. Thereafter, as shown in FIG. 10D, a dielectric film 37, which is a material of the sidewall 25, is formed so as to cover exposed surfaces of the gate electrode 24, the gate insulating film 23, the gate metal film 22, and the gate layer material film 31. The dielectric film 37 includes, for example, SiN. Next, as shown in FIG. OE, portions of the dielectric film 37 other than the portions covering the side surfaces of the gate electrode 24, the gate insulating film 23, and the gate metal film 22 are removed by anisotropic dry etching. Thus, the sidewall 25 including the dielectric film 37 and covering the side surfaces of the gate electrode 24, the gate insulating film 23, and the gate metal film 22 is formed.

Figure 10F:
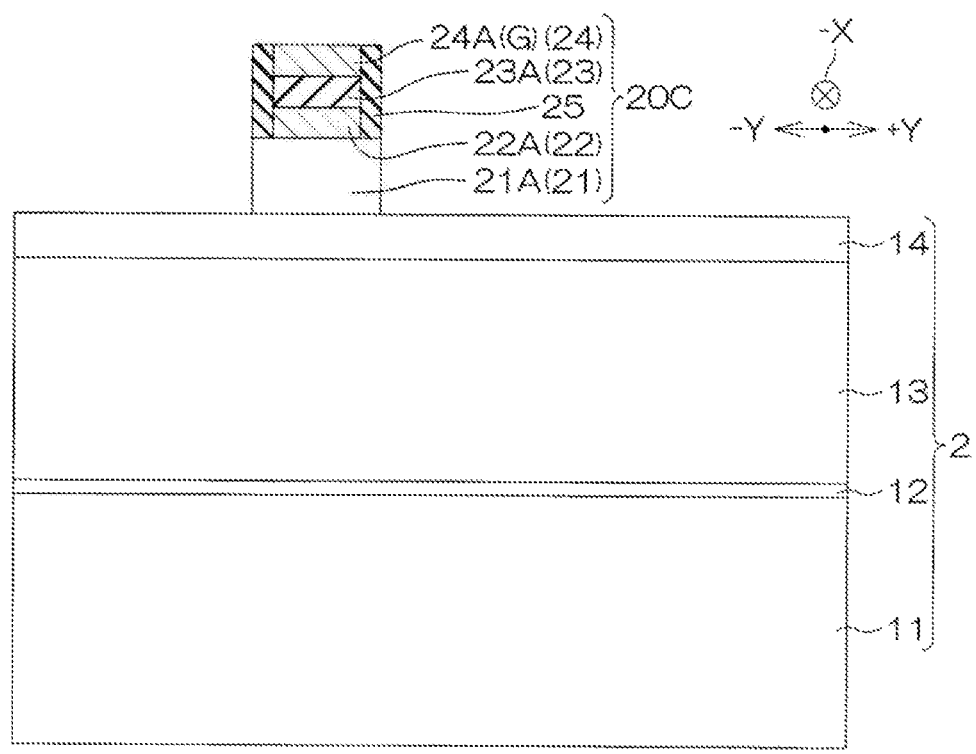
FIG. 10F is a cross-sectional view showing a process subsequent to FIG. 10E.

Next, as shown in FIG. 10F, the gate layer material film 31 is selectively removed by dry etching using the gate electrode 24 and the sidewall 25 as a mask until the surface of the second nitride semiconductor layer 14 is exposed. Thus, the semiconductor gate layer 21 formed on the second nitride semiconductor layer 14 is formed. The semiconductor gate layer 21 includes the ridge portion 21A disposed below the main metal film portion 22A of the gate metal film 22, and the connection portion 21B disposed below the connection portion 22B of the gate metal film 22. However, the main metal film portion 22A is formed on an intermediate portion in a width of the upper surface of the ridge portion 21A, and the connection portion 22B of the gate metal film 22 is formed on an intermediate portion in a width of the upper surface of the connection portion 21B of the semiconductor gate layer 21.

Figure 10G:
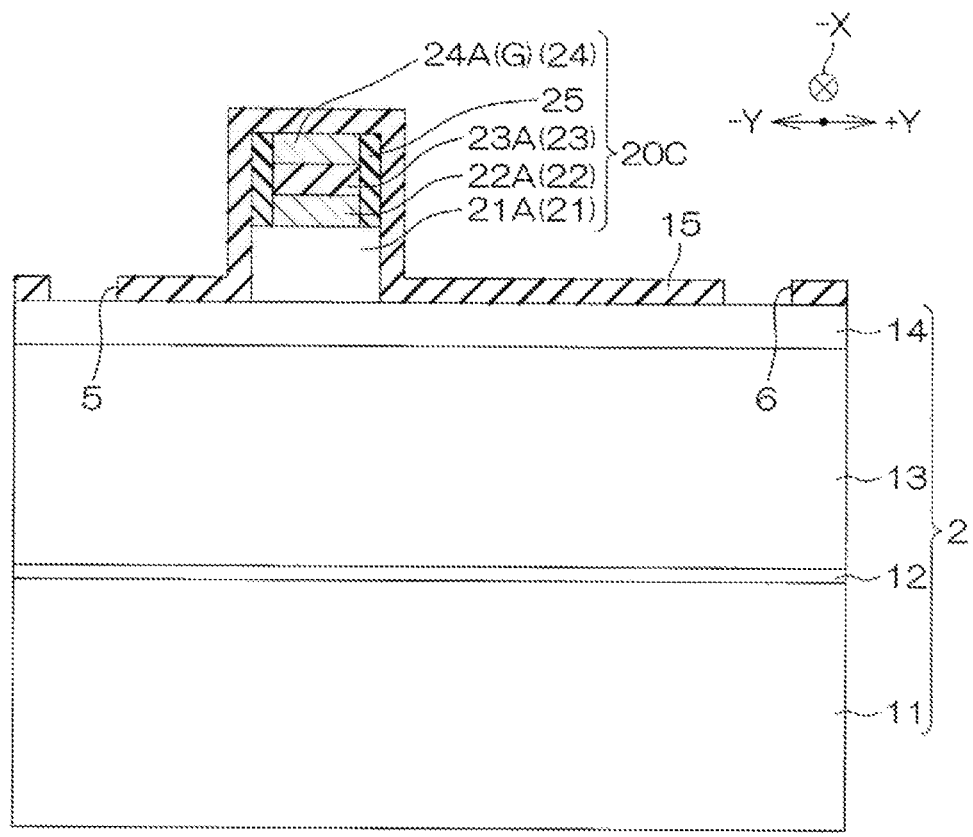
FIG. 10G is a cross-sectional view showing a process subsequent to FIG. 10F.

Thus, the gate portion 20C including the ridge portion 21A of the semiconductor gate layer 21, the main metal film portion 22A of the gate metal film 22, the main insulating film portion 23A of the gate insulating film 23, the gate main electrode portion 24A of the gate electrode 24, and the sidewall 25 is formed. Next, as shown in FIG. 10G, a passivation film 15 is formed so as to cover the entire exposed surface. The passivation film 15 includes, for example, SiN. Then, the source contact hole 5 and the drain contact hole 6 reaching the second nitride semiconductor layer 14 are formed in the passivation film 15.

Figure 10H:
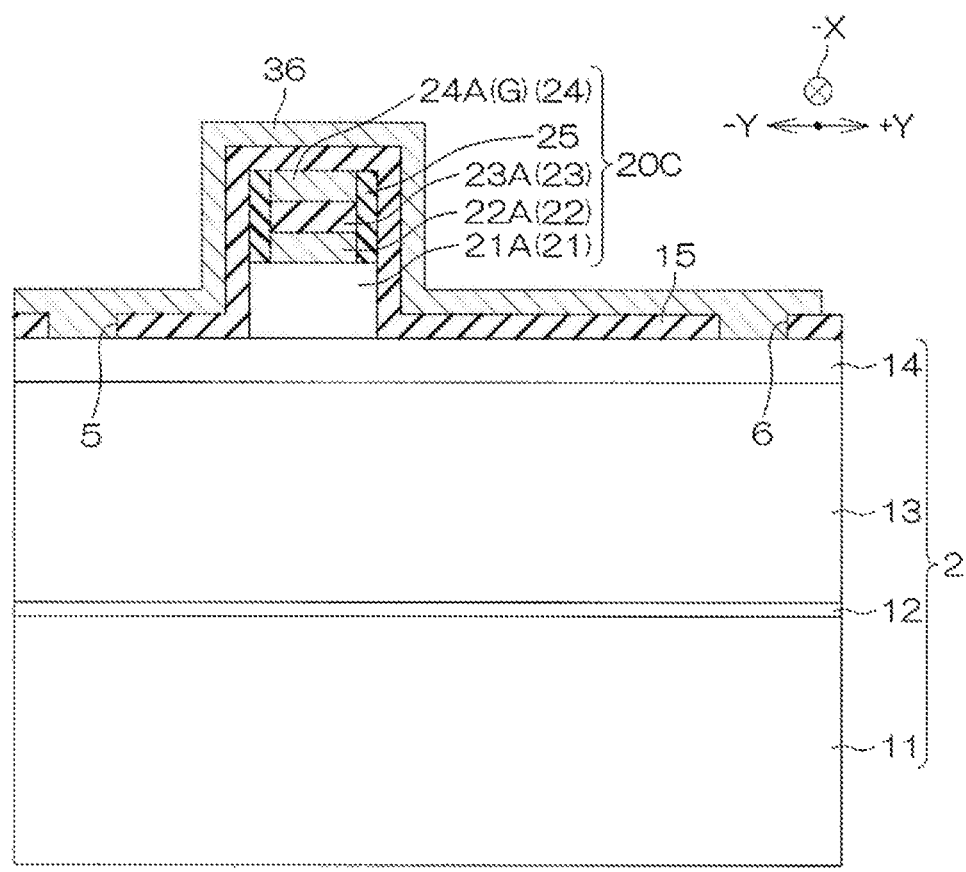
FIG. 10H is a cross-sectional view showing a process subsequent to FIG. 10G.

Next, as shown in FIG. 10H, a source/drain electrode film 36 is formed so as to cover the entire exposed surface. Finally, by patterning the source/drain electrode film 36 by photolithography and etching, the source electrode 3 and the drain electrode 4, which are in ohmic contact with the second nitride semiconductor layer 14, are formed. Thus, the nitride semiconductor device 1 having the structure as shown in FIG. 9 is obtained.

Figure 11:
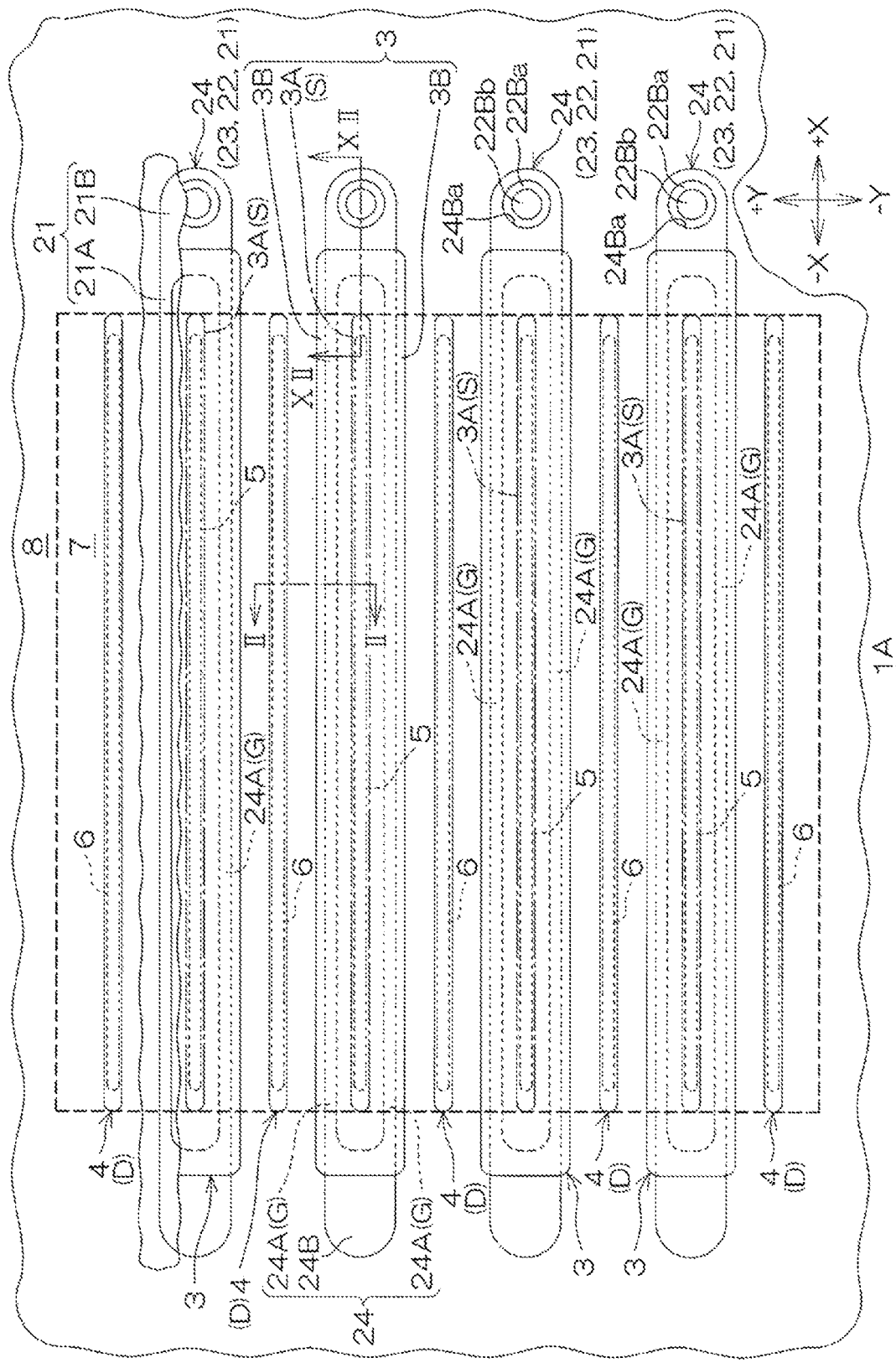
FIG. 11 is a partial plan view for explaining a configuration of a nitride semiconductor device according to a second embodiment of the present disclosure.
Figure 12:
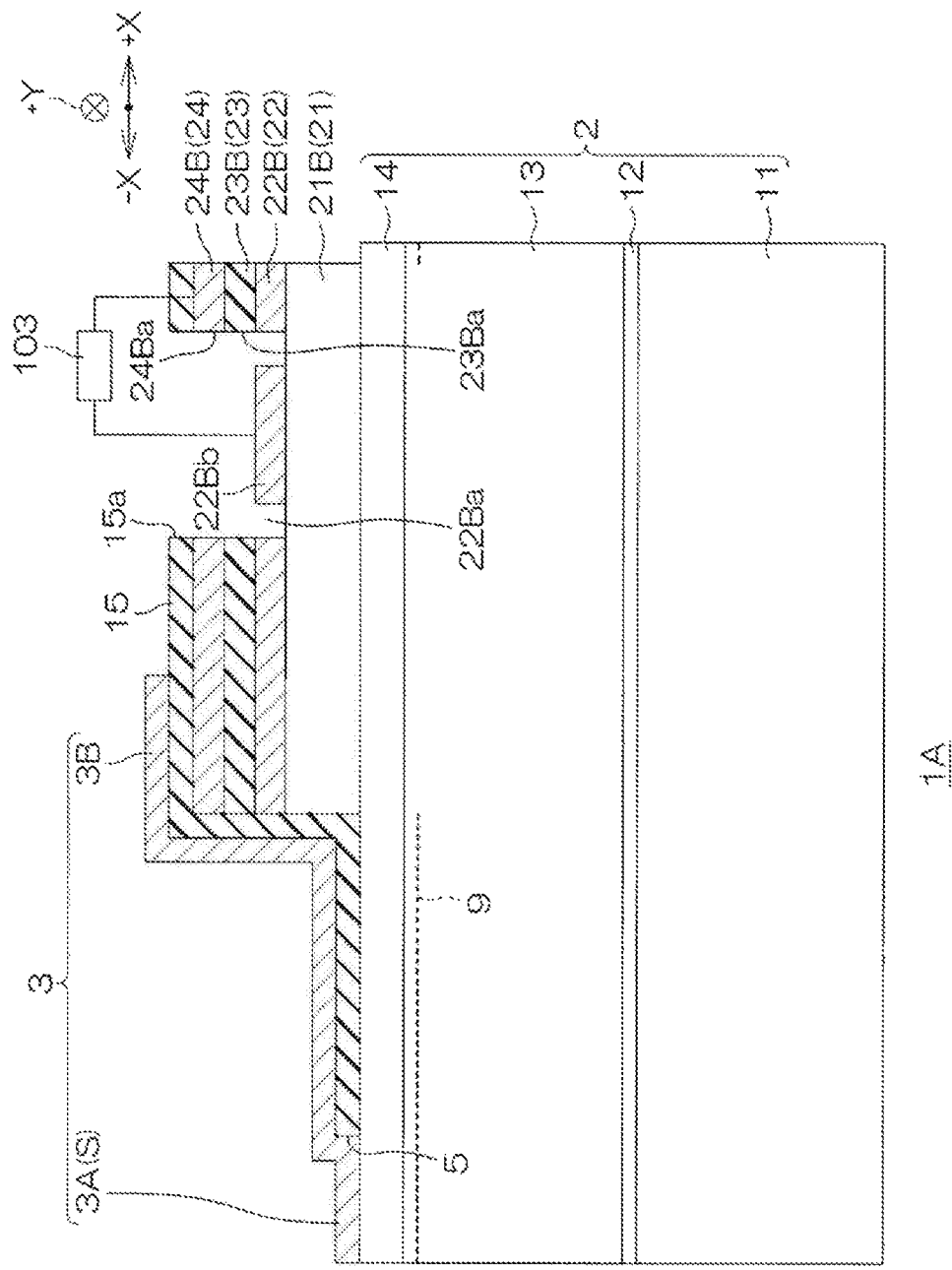
FIG. 12 is an enlarged cross-sectional view taken along line XII-XII in FIG. 11.

FIG. 11 is a partial plan view for explaining a nitride semiconductor device A according to a second embodiment of the present disclosure. In FIG. 11, parts corresponding to the respective parts in FIG. 1 described above are denoted by the same reference numerals as in FIG. 1. A cross-sectional view taken along line II-II of FIG. 11 is the same as the cross-sectional view of FIG. 2 described above. FIG. 12 is an enlarged cross-sectional view taken along line XII-XII in FIG. 11. In FIG. 12, parts corresponding to the respective parts in FIG. 3 described above are denoted by the same reference numerals as in FIG. 3. However, in FIG. 11, the passivation film denoted by reference numeral 15 in FIGS. 2 and 12 is omitted for convenience of description.

The nitride semiconductor device TA according to the second embodiment is substantially the same as the nitride semiconductor device 1 according to the first embodiment shown in FIGS. 1 to 3. In the nitride semiconductor device TA according to the second embodiment, as shown in FIG. 12, an opening 15a having a circular shape in the plan view is formed in the passivation film 15 on one of the two connection portions 21B of the semiconductor gate layer 21 (the connection portion 21B on the +X direction side in this example).

As shown in FIGS. 11 and 12, an opening 24Ba having a circular shape in the plan view communicating with the opening 15a is formed in the base portion 24B on the +X direction side of the gate electrode 24. An opening 23Ba having a circular shape in the plan view communicating with the opening 24Ba is formed in the connecting portion 23B on the +X direction side of the gate insulating film 23. An opening 22Ba having an annular shape in the plan view whose outer peripheral edge coincides with the outer peripheral edge of the opening 23Ba in the plan view is formed in the connection portion 22B on the +X direction side of the gate metal film 22. Thus, the connection portion 22B on the +X direction side of the gate metal film 22 includes a terminal portion 22Bb having a circular shape in a plan view surrounded by the annular opening 22Ba.

Figure 13:
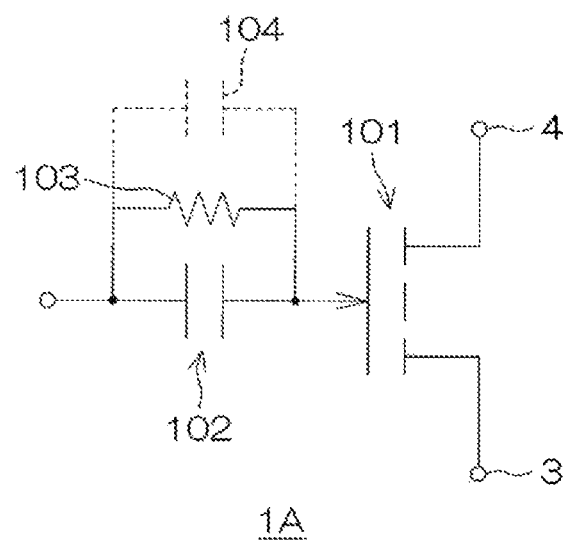
FIG. 13 is an electric circuit diagram showing an internal electrical structure of the nitride semiconductor device of FIG. 11.

In the nitride semiconductor device TA according to the second embodiment, as shown in FIG. 12, a resistor 103 is connected between the terminal portion 22Bb and the gate electrode 24. FIG. 13 shows a diagram of an electric circuit in the nitride semiconductor device A. In FIG. 13, parts corresponding to the respective parts in FIG. 6 described above are denoted by the same reference numerals as in FIG. 6. When the resistor 103 is connected between the terminal portion 22Bb and the gate electrode 24, the resistor 103 is connected in parallel with a capacitor 102. The resistance value of the resistor 103 is, for example, about 1 kΩ to 10 kΩ. Thus, the potential between the gate of the HEMT 101 and the capacitor 102 can be fixed so that the threshold voltage can be stabilized.

As indicated by a broken line in FIG. 13, a capacitor 104 may be further connected between the terminal portion 22Bb and the gate electrode 24. Note that only the capacitor 104 may be connected between the terminal portion 22Bb and the gate electrode 24 without connecting the resistor 103 therebetween. Although the embodiments of the present disclosure have been described above, the present disclosure may be embodied in other embodiments. For example, in the above-described embodiments, silicon is illustrated as an example of the material of the substrate 11, but other substrate materials such as a sapphire substrate and a GaN substrate may be applied.

Other various design changes can be made within the scope of the matters described in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device comprising:
   a first nitride semiconductor layer constituting an electron transit layer;
   a second nitride semiconductor layer formed on the first nitride semiconductor layer and constituting an electron supply layer;
   a ridge-shaped gate portion formed on the second nitride semiconductor layer; and
   a source electrode and a drain electrode disposed on the second nitride semiconductor layer so as to face each other with the ridge-shaped gate portion interposed therebetween,
   wherein the ridge-shaped gate portion includes:
      a nitride semiconductor gate layer containing acceptor-type impurities and disposed on the second nitride semiconductor layer;
      a gate metal film disposed on, and in direct contact with, the nitride semiconductor gate layer;
      a gate insulating film formed on the gate metal film; and
      a gate electrode capacitively-coupled to the gate metal film by the gate insulating film.

2. The nitride semiconductor device of claim 1, wherein the gate insulating film covers an entire upper surface of the gate metal film in an area where the source electrode and the drain electrode face each other with the ridge-shaped gate portion interposed therebetween, and
   wherein the gate electrode covers an entire upper surface of the gate insulating film in the area where the source electrode and the drain electrode face each other with the ridge-shaped gate portion interposed therebetween.

3. The nitride semiconductor device of claim 1, wherein a side surface of the gate insulating film is formed on an inclined surface inclined with respect to a surface of the nitride semiconductor gate layer.

4. The nitride semiconductor device of claim 1, wherein both side edges of the gate metal film are recessed inward from corresponding side edges of the nitride semiconductor gate layer in a plan view.

5. The nitride semiconductor device of claim 1, wherein the nitride semiconductor gate layer has an extension portion extending outside an area where the source electrode and the drain electrode face each other, and
   wherein an opening that continuously penetrates the gate electrode and the gate insulating film and exposes the gate metal film is formed on the extension portion.

6. The nitride semiconductor device of claim 1, further comprising: a resistor connected between the gate metal film and the gate electrode.

7. The nitride semiconductor device of claim 1, further comprising: a capacitor connected between the gate metal film and the gate electrode.

8. The nitride semiconductor device of claim 1, wherein the gate insulating film is formed of a single film of any one of $SiO_2$, $Al_2O_3$, and $HfO_2$, or a stacked film including any combination of two or more thereof.

9. The nitride semiconductor device of claim 1, wherein the gate metal film and the gate electrode are each formed of a single film of any one of Ti, TiN, and TiW, or a stacked film including any combination of two or more thereof.

10. The nitride semiconductor device of claim 1, wherein the gate metal film and the gate electrode are formed of a same metal film.

11. The nitride semiconductor device of claim 1, wherein the first nitride semiconductor layer is formed of a GaN layer, the second nitride semiconductor layer is formed of an $Al_xGa_{(1-x)}N$ (0<x<1) layer, and the nitride semiconductor gate layer is formed of a p-type GaN layer.

12. A method of manufacturing a nitride semiconductor device comprising:
   a first nitride semiconductor layer constituting an electron transit layer;
   a second nitride semiconductor layer formed on the first nitride semiconductor layer and constituting an electron supply layer;
   a ridge-shaped gate portion formed on the second nitride semiconductor layer; and
   a source electrode and a drain electrode disposed on the second nitride semiconductor layer so as to face each other with the ridge-shaped gate portion interposed therebetween,
   wherein the ridge-shaped gate portion includes:

a nitride semiconductor gate layer containing acceptor-type impurities and disposed on the second nitride semiconductor layer, a gate metal film disposed on the nitride semiconductor gate layer, a gate insulating film formed on the gate metal film, and a gate electrode capacitively-coupled to the gate metal film by the gate insulating film, the method comprising:

forming, on a substrate, the first nitride semiconductor layer, the second nitride semiconductor layer, and a semiconductor gate layer material film which is a material film of the nitride semiconductor gate layer in sequence;

forming, on the semiconductor gate layer material film, a gate metal material film which is a material film of the gate metal film, a gate insulating material film which is a material film of the gate insulating film, and a gate electrode film which is a material film of the gate electrode in sequence, wherein the gate metal material film is formed to be in direct contact with the semiconductor gate layer material film;

patterning the gate electrode film, the gate insulating material film, the gate metal material film, and the semiconductor gate layer material film by etching to form, on the second nitride semiconductor layer, the ridge-shaped gate portion in which the nitride semiconductor gate layer, the gate metal film, the gate insulating film, and the gate electrode are stacked;

forming, on the second nitride semiconductor layer, a passivation film covering exposed surfaces of the ridge-shaped gate portion and the second nitride semiconductor layer; and forming, on both sides of the ridge-shaped gate portion, the source electrode and the drain electrode, respectively, that penetrate the passivation film and are in ohmic contact with the second nitride semiconductor layer.

13. The method of claim 12, wherein the act of patterning includes patterning using a single mask.

14. The method of claim 12, wherein the act of patterning includes at least two etching processes.

15. The method of claim 14, wherein the act of patterning includes:

a first etching process of patterning the gate electrode film, the gate insulating material film, and the gate metal material film; and a second etching process of patterning the semiconductor gate layer material film.

16. The method of claim 15, further comprising, between the first etching process and the second etching process:

forming a dielectric film on the semiconductor gate layer material film so as to cover exposed surfaces of the gate electrode film, the gate insulating material film, and the gate metal material film and an exposed surface of the semiconductor gate layer material film after the first etching process before the second etching process; and forming a sidewall covering side surfaces of the gate electrode film, the gate insulating material film, and the gate metal material film after the first etching process by anisotropically dry-etching the dielectric film.

17. A nitride semiconductor device comprising:

a substrate comprising a first surface;

a first nitride semiconductor layer constituting an electron transit layer;

a second nitride semiconductor layer formed on the first nitride semiconductor layer and constituting an electron supply layer;

a ridge-shaped gate portion formed on the second nitride semiconductor layer; and a source electrode and a drain electrode disposed on the second nitride semiconductor layer so as to face each other with the ridge-shaped gate portion interposed therebetween, wherein the ridge-shaped gate portion includes:

a nitride semiconductor gate layer containing acceptor-type impurities and disposed on the second nitride semiconductor layer;

a gate metal film disposed on the nitride semiconductor gate layer;

a gate insulating film formed on the gate metal film; and a gate electrode capacitively-coupled to the gate metal film by the gate insulating film, and wherein sidewalls of the nitride semiconductor gate layer are directly vertically aligned in a vertical direction with sidewalls of the gate metal film with respect to the first surface of the substrate.

18. The nitride semiconductor device of claim 17, wherein the gate insulating film covers an entire upper surface of the gate metal film in an area where the source electrode and the drain electrode face each other with the ridge-shaped gate portion interposed therebetween, and wherein the gate electrode covers an entire upper surface of the gate insulating film in the area where the source electrode and the drain electrode face each other with the ridge-shaped gate portion interposed therebetween.

19. The nitride semiconductor device of claim 17, wherein a side surface of the gate insulating film is formed on an inclined surface inclined with respect to a surface of the nitride semiconductor gate layer.

20. The nitride semiconductor device of claim 17, wherein both side edges of the gate metal film are recessed inward from corresponding side edges of the nitride semiconductor gate layer in a plan view.

* * * * *